United States Patent
Buttolo et al.

(10) Patent No.: US 9,311,204 B2
(45) Date of Patent: Apr. 12, 2016

(54) PROXIMITY INTERFACE DEVELOPMENT SYSTEM HAVING REPLICATOR AND METHOD

(71) Applicant: Ford Global Technologies, LLC, Dearborn, MI (US)

(72) Inventors: Pietro Buttolo, Dearborn Heights, MI (US); Stuart C. Salter, White Lake, MI (US); Matthew Majkowski, Dearborn, MI (US); James J. Surman, Clinton Township, MI (US); James Stewart Rankin, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 487 days.

(21) Appl. No.: 13/799,413

(22) Filed: Mar. 13, 2013

(65) Prior Publication Data
US 2014/0278240 A1   Sep. 18, 2014

(51) Int. Cl.
| | |
|---|---|
| G06F 11/30 | (2006.01) |
| G06F 3/044 | (2006.01) |
| H03K 17/955 | (2006.01) |
| H03K 17/96 | (2006.01) |

(52) U.S. Cl.
CPC ............. *G06F 11/30* (2013.01); *G06F 3/044* (2013.01); *H03K 17/955* (2013.01); *H03K 17/9622* (2013.01); *G06F 2203/04108* (2013.01); *H03K 2217/94031* (2013.01)

(58) Field of Classification Search
CPC ...................................................... G06F 11/30
USPC ....................................................... 702/182
See application file for complete search history.

(56) References Cited

U.S. PATENT DOCUMENTS

| | | | |
|---|---|---|---|
| 3,382,588 A | 5/1968 | Serrell et al. | |
| 3,544,804 A | 12/1970 | Gaumer et al. | |

(Continued)

FOREIGN PATENT DOCUMENTS

| | | |
|---|---|---|
| DE | 4024052 | 1/1992 |
| EP | 1152443 | 11/2001 |

(Continued)

OTHER PUBLICATIONS

U.S. Appl. No. 13/609,390, filed Sep. 11, 2012, entitled "Proximity Switch Based Door Latch Release," (14 pages of specification and 4 pages of drawings) and Official Filing Receipt (3 pages).

(Continued)

*Primary Examiner* — Bryan Bui
(74) *Attorney, Agent, or Firm* — Vichit Chea; Price Heneveld LLP

(57) ABSTRACT

A development system and method are provided for testing proximity sensor interfaces, such as a capacitive switch assembly which may be employed in an automotive vehicle. The system includes software routines stored in memory for operating a proximity sensor interface having a plurality of sensors, and a data log including user outputs of the proximity sensors. The development system includes a replicator for replicating the proximity sensor interface based on the software routines and the data log and generating outputs of the proximity sensor interface to determine performance. The system further includes an analyzer for processing the test data for proper activation of the proximity sensor interface and generating an output indicative of the test results.

9 Claims, 20 Drawing Sheets

(56) References Cited

U.S. PATENT DOCUMENTS

| | | |
|---|---|---|
| 3,691,396 A | 9/1972 | Hinrichs |
| 3,707,671 A | 12/1972 | Morrow et al. |
| 3,725,589 A | 4/1973 | Golden |
| 3,826,979 A | 7/1974 | Steinmann |
| 3,950,748 A | 4/1976 | Busy |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |
| 4,377,049 A | 3/1983 | Simon et al. |
| 4,380,040 A | 4/1983 | Posset |
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,050,634 A | 9/1991 | Fiechtner |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,212,621 A | 5/1993 | Panter |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,526,294 A | 6/1996 | Ono et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,801,340 A | 9/1998 | Peter |
| 5,825,352 A | 10/1998 | Bisset et al. |
| 5,827,980 A | 10/1998 | Doemens et al. |
| 5,864,105 A | 1/1999 | Andrews |
| 5,867,111 A | 2/1999 | Caldwell et al. |
| 5,874,672 A | 2/1999 | Gerardi et al. |
| 5,880,538 A | 3/1999 | Schulz |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,404,158 B1 | 6/2002 | Boisvert et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,535,694 B2 | 3/2003 | Engle et al. |
| 6,537,359 B1 | 3/2003 | Spa |
| 6,538,579 B1 | 3/2003 | Yoshikawa et al. |
| 6,559,902 B1 | 5/2003 | Kusuda et al. |
| 6,587,097 B1 | 7/2003 | Aufderheide et al. |
| 6,603,306 B1 | 8/2003 | Olsson et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,646,398 B1 | 11/2003 | Fukazawa et al. |
| 6,652,777 B2 | 11/2003 | Rapp et al. |
| 6,654,006 B2 | 11/2003 | Kawashima et al. |
| 6,661,239 B1 | 12/2003 | Ozick |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |

(56) References Cited

U.S. PATENT DOCUMENTS

| | | |
|---|---|---|
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | McCall |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,347,297 B2 | 3/2008 | Ide et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,447,575 B2 | 11/2008 | Goldbeck et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,710,245 B2 | 5/2010 | Pickering |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | MacKey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,076,949 B1 | 12/2011 | Best et al. |
| 8,077,154 B2 | 12/2011 | Emig et al. |
| 8,090,497 B2 | 1/2012 | Ando |
| 8,253,425 B2 | 8/2012 | Reynolds |
| 8,283,800 B2 | 10/2012 | Salter et al. |
| 8,330,385 B2 | 12/2012 | Salter et al. |
| 8,339,286 B2 | 12/2012 | Cordeiro |
| 8,386,027 B2 | 2/2013 | Chuang et al. |
| 8,454,181 B2 | 6/2013 | Salter et al. |
| 8,456,180 B2 | 6/2013 | Sitarski |
| 8,508,487 B2 | 8/2013 | Schwesig et al. |
| 8,517,383 B2 | 8/2013 | Wallace et al. |
| 8,537,107 B1 | 9/2013 | Li |
| 8,570,053 B1 | 10/2013 | Ryshtun et al. |
| 8,575,949 B2 | 11/2013 | Salter et al. |
| 8,659,414 B1 | 2/2014 | Schuk |
| 8,908,034 B2 | 12/2014 | Bordonaro |
| 8,933,708 B2 | 1/2015 | Buttolo et al. |
| 8,981,265 B2 | 3/2015 | Jiao et al. |
| 9,065,447 B2 * | 6/2015 | Buttolo ................ H03K 17/955 |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2003/0189211 A1 | 10/2003 | Dietz |
| 2004/0056753 A1 | 3/2004 | Chiang et al. |
| 2004/0090195 A1 | 5/2004 | Motsenbocker |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0012484 A1 | 1/2005 | Gifford et al. |
| 2005/0052429 A1 | 3/2005 | Philipp |
| 2005/0068045 A1 | 3/2005 | Inaba et al. |
| 2005/0068712 A1 | 3/2005 | Schulz et al. |
| 2005/0073425 A1 | 4/2005 | Snell et al. |
| 2005/0088417 A1 | 4/2005 | Mulligan |
| 2005/0092097 A1 | 5/2005 | Shank et al. |
| 2005/0110769 A1 | 5/2005 | DaCosta et al. |
| 2005/0137765 A1 | 6/2005 | Hein et al. |
| 2005/0218913 A1 | 10/2005 | Inaba et al. |
| 2005/0242923 A1 | 11/2005 | Pearson et al. |
| 2005/0275567 A1 | 12/2005 | DePue et al. |
| 2005/0283280 A1 | 12/2005 | Evans, Jr. |
| 2006/0022682 A1 | 2/2006 | Nakamura et al. |
| 2006/0038793 A1 | 2/2006 | Philipp |

(56) References Cited

U.S. PATENT DOCUMENTS

| | | |
|---|---|---|
| 2006/0044800 A1 | 3/2006 | Reime |
| 2006/0055534 A1 | 3/2006 | Fergusson |
| 2006/0082545 A1 | 4/2006 | Choquet et al. |
| 2006/0170241 A1 | 8/2006 | Yamashita |
| 2006/0238518 A1 | 10/2006 | Westerman et al. |
| 2006/0238521 A1 | 10/2006 | Westerman et al. |
| 2006/0244733 A1 | 11/2006 | Geaghan |
| 2006/0250142 A1 | 11/2006 | Abe |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0115759 A1 | 5/2007 | Sano |
| 2007/0206668 A1 | 9/2007 | Jin |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0271072 A1 | 11/2007 | Kovacevich |
| 2007/0296709 A1 | 12/2007 | GuangHai |
| 2008/0012935 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0246723 A1 | 10/2008 | Baumbach |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0212849 A1 | 8/2009 | Reime |
| 2009/0225043 A1 | 9/2009 | Rosener |
| 2009/0235588 A1 | 9/2009 | Patterson et al. |
| 2009/0236210 A1 | 9/2009 | Clark et al. |
| 2009/0251435 A1 | 10/2009 | Westerman et al. |
| 2009/0256578 A1 | 10/2009 | Wuerstlein et al. |
| 2009/0256677 A1 | 10/2009 | Hein et al. |
| 2009/0273563 A1 | 11/2009 | Pryor |
| 2009/0295409 A1 | 12/2009 | Irkliy |
| 2009/0295556 A1 | 12/2009 | Inoue et al. |
| 2009/0309616 A1 | 12/2009 | Klinghult et al. |
| 2010/0001746 A1 | 1/2010 | Duchene et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0066391 A1 | 3/2010 | Hirasaka et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0117970 A1 | 5/2010 | Burstrom et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0252048 A1 | 10/2010 | Young et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0057899 A1 | 3/2011 | Sleeman et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0139934 A1 | 6/2011 | Giesa et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0163764 A1 | 7/2011 | Shank et al. |
| 2011/0169758 A1 | 7/2011 | Aono |
| 2011/0187492 A1 | 8/2011 | Newman et al. |
| 2011/0210755 A1 | 9/2011 | Ogawa |
| 2011/0279276 A1 | 11/2011 | Newham |
| 2011/0279409 A1 | 11/2011 | Salaverry et al. |
| 2011/0309912 A1 | 12/2011 | Muller |

(56) References Cited

U.S. PATENT DOCUMENTS

| | | |
|---|---|---|
| 2012/0007821 A1 | 1/2012 | Zaliva |
| 2012/0037485 A1 | 2/2012 | Sitarski |
| 2012/0043973 A1 | 2/2012 | Kremin |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0104790 A1 | 5/2012 | Plavetich et al. |
| 2012/0154324 A1 | 6/2012 | Wright et al. |
| 2012/0217147 A1 | 8/2012 | Porter et al. |
| 2012/0293447 A1 | 11/2012 | Heng et al. |
| 2012/0312676 A1 | 12/2012 | Salter et al. |
| 2012/0313648 A1 | 12/2012 | Salter et al. |
| 2012/0313767 A1 | 12/2012 | Sitarski |
| 2012/0319992 A1 | 12/2012 | Lee |
| 2013/0024169 A1 | 1/2013 | Veerasamy |
| 2013/0033356 A1 | 2/2013 | Sitarski et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0170013 A1 | 7/2013 | Tonar et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0321065 A1 | 12/2013 | Salter et al. |
| 2013/0328616 A1 | 12/2013 | Buttolo et al. |
| 2014/0002405 A1 | 1/2014 | Salter et al. |
| 2014/0145733 A1 | 5/2014 | Buttolo et al. |
| 2014/0252879 A1 | 9/2014 | Dassanayake et al. |
| 2014/0306723 A1 | 10/2014 | Salter et al. |
| 2014/0306724 A1 | 10/2014 | Dassanayake et al. |
| 2015/0077227 A1 | 3/2015 | Salter et al. |
| 2015/0180471 A1 | 6/2015 | Buttolo et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |
| KR | 101258376 | 4/2013 |
| WO | 9636960 | 11/1996 |
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

"Touch Sensors Design Guide" by Atmel, 10620 D-AT42-04/09, Revised Apr. 2009, 72 pages, Copyrighted 2008-2009 Atmel Corporation.

U.S. Appl. No. 13/721,886, filed Dec. 20, 2012 (Filing Receipt, Application and Drawings), 43 pages.

U.S. Appl. No. 14/635,140, filed Mar. 2, 2015, entitled "Proximity Switch Having Wrong Touch Adaptive Learning and Method," (20 pages of specification and 7 pages of drawings) and Official Filing Receipt (3 pages).

U.S. Appl. No. 14/661,325, filed Mar. 18, 2015, entitled "Proximity Switch Assembly Having Haptic Feedback and Method," (31 pages of specification and 15 pages of drawings) and Official Filing Receipt (3 pages).

U.S. Appl. No. 14/689,324, filed Apr. 17, 2015, entitled "Proximity Switch Assembly With Signal Drift Rejection and Method," (35 pages of specification and 17 pages of drawings) and Official Filing Receipt (3 pages).

U.S. Appl. No. 14/717,031, filed May 20, 2015, entitled "Proximity Sensor Assembly Having Interleaved Electrode Configuration," (38 pages of specification and 21 pages of drawings) and Official Filing Receipt (3 pages).

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Rivision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-01-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 10/10, 8 pages, Silicon Laboratories, Inc., © 2010.

(56) References Cited

OTHER PUBLICATIONS

"Clevios P Formulation Guide," 12 pages, www.clevios.com, Heraeus Clevios GmbH, no date provided.
"Charge-Transfer Sensing-Based Touch Controls Facilitate Creative Interfaces," www.ferret.com.au, 2 pages, Jan. 18, 2006.
Kiosk Peripherals, "Touch Screen," www.bitsbytesintegrators.com/kiosk-peripherals.html, 10 pages, no date provided.
JVC KD-AVX777 Detachable Front-Panel with Integrated 5.4" Touch-Screen Monitor, 6 pages, www.crutchfield.com, no date provided.
Ergonomic Palm Buttons, Pepperl+Fuchs, www.wolfautomation.com, 6 pages, no date provided.
"Orgacon EL-P3000, Screen printing Ink Series 3000," 2 pages, AGFA, last updated in Feb. 2006.
U.S. Appl. No. 14/518,141, filed Oct. 20, 2014, entitled "Directional Proximity Switch Assemby," (23 pages of specification and 13 pages of drawings) and Official Filing Receipt (3 pages).
U.S. Appl. No. 14/552,809, filed Nov. 25, 2014, entitled "Proximity Switch Based Door Latch Release," (14 pages of specification and 4 pages of drawings) and Official Filing Receipt (3 pages).

\* cited by examiner

| TIME | 00:23:12 | 00:23:15 | 00:23:17 | 00:23:20 | 00:23:23 |
|---|---|---|---|---|---|
| SAMPLE | 136 | 208 | 278 | 347 | 422 |
| CH | 0 | 2 | 4 | 3 | 1 |
| EVENT | ACTIVATE_STABLE | ACTIVATE_STABLE | ACTIVATE_STABLE | ACTIVATE_STABLE | ACTIVATE_STABLE |
| GLOVE_WAIT | 0 | 0 | 0 | 0 | 0 |
| WAIT | 4 | 5 | 3 | 3 | 4 |
| MAX_CH | 194 | 297 | 257 | 322 | 184 |
| SUM_CH | 251 | 481 | 395 | 463 | 244 |
| RATIO (MAX/SUM) | 1.29 | 1.61 | 1.53 | 1.43 | 1.32 |
| PEAK_MAX | 200 | 297 | 257 | 324 | 191 |
| PEAK_SUM | 259 | 481 | 395 | 468 | 276 |
| MAX_RATIO | 1.29 | 1.61 | 1.53 | 1.44 | 1.44 |
| N_ACT_CH | 1 | 2 | 1 | 1 | 1 |
| SECOND MAX_CH | 37 | 92 | 60 | 65 | 28 |
| CH_STABLE | 1 | 1 | 1 | 1 | 1 |
| RATE_INHIBIT | 0 | 0 | 0 | 0 | 0 |
| RATE_MAX | 201 | 294 | 254 | 325 | 196 |

FIG. 21

| EVENT_TYPE | CH0 | CH1 | CH2 | CH3 | CH4 | CH5 | CH6 | CH7 |
|---|---|---|---|---|---|---|---|---|
| SCORE | 0.70 | 0.88 | 1 | 0.97 | 1 | 1 | 1 | 1 |
| PASS | 39 | 39 | 23 | 39 | 17 | 36 | 20 | 50 |
| FAIL | 16 | 5 | 0 | 1 | 0 | 0 | 0 | 0 |
|  |  |  |  |  |  |  |  |  |
| HUNT | 0 | 0 | 0 | 0 | 0 | 0 | 0 | 0 |
|  |  |  |  |  |  |  |  |  |
| ACTIVATE_STABLE | 35 | 35 | 22 | 38 | 17 | 35 | 20 | 44 |
| ACTIVATE_TAP | 4 | 4 | 1 | 1 | 0 | 1 | 0 | 6 |
| ACTIVATE_GLOVE | 0 | 0 | 0 | 0 | 0 | 0 | 0 | 0 |
| HUNTING_EVENT | 0 | 0 | 0 | 0 | 0 | 0 | 0 | 0 |
| NOACT_ON_RATE | 16 | 5 | 0 | 1 | 0 | 0 | 0 | 0 |
| NOACT_ON_KEYUP | 0 | 0 | 0 | 0 | 0 | 0 | 0 | 0 |
| NOACT_ON_NEWCH | 0 | 0 | 0 | 0 | 0 | 0 | 0 | 0 |
| NOACT_ON_GLOVE | 0 | 0 | 0 | 0 | 0 | 0 | 0 | 0 |
| LOCKOUT_ABORT | 0 | 0 | 0 | 0 | 0 | 0 | 0 | 0 |
| LOCKOUT_OPEN | 0 | 0 | 0 | 0 | 0 | 0 | 0 | 0 |

FIG. 22

| CH_ACTIVATION | ACTIV_TYPE | DURATION |
|---|---|---|
| 0 | 1 | 30 |
| 2 | 1 | 33 |
| 4 | 1 | 32 |
| 3 | 1 | 33 |
| 1 | 1 | 32 |

FIG. 23

PROXIMITY INTERFACE DEVELOPMENT SYSTEM HAVING REPLICATOR AND METHOD

FIELD OF THE INVENTION

The present invention generally relates to user interfaces, and more particularly relates to a development tool for testing and development of proximity interfaces such as proximity switches used in vehicles.

BACKGROUND OF THE INVENTION

Capacitive sensor interfaces are increasingly employed on various electronic devices including smartphones, appliances and vehicle instrument panels to replace traditional mechanical switches. In automotive applications, capacitive sensor interfaces may be employed to operate devices including powered windows, headlights, windshield wipers, moonroofs or sunroofs, interior lighting, radio information, infotainment devices and various other devices. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

A capacitive switch typically does not provide a digital on/off input, but instead provides a sensor value dependent on various characteristics including the operator's finger size, posture and distance. As such, the logic to interpret the operator intent to operate one or more switches is generally more complex than a traditional mechanical switch. Due to the different operators and uses, it may be difficult to efficiently develop a capacitive sensor interface that is well suited for use by different operators. In the automotive application, the development of these types of proximity sensor interfaces typically includes environmental testing of the interfaces by a large pool of users in a customer clinic, which generally involves an expensive and time-consuming process. If changes such as changing tuning parameters in software need to be made to the sensor interfaces, the testing may have to be repeated. It would be desirable to provide for a development system that reduces the time and cost for testing and developing capacitive sensor interfaces, particular for use in the automotive environment.

SUMMARY OF THE INVENTION

According to one aspect of the present invention, a proximity interface development system is provided. The proximity interface development system includes software routines developed to operate a proximity sensor interface having a plurality of proximity sensors. The system also includes a data log including expected user outputs of the proximity sensors and a replicator for replicating the proximity sensor interface based on the software routines and the data log and generating an expected output of the proximity sensor interface for determining performance.

According to a further aspect of the present invention, a method of developing a proximity sensor interface is provided. The method includes the steps of providing software routines developed to operate a proximity sensor interface having a plurality of sensors, and receiving a data log including expected user outputs of the proximity sensors. The method further includes the steps of replicating operation of the interface by processing the software routines, and generating data indicative of performance of the capacitive sensor interface.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 21 is a table illustrating a sampling of proximity switch activation events acquired and processed by the development system, according to one example;

FIG. 22 is a table illustrating event DOE log data showing the output from multiple tests combined by the analyzer into a summary chart, according to one example;

FIG. 23 is a table illustrating a simplified output report presenting test results showing activation type and duration, according to one example;

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
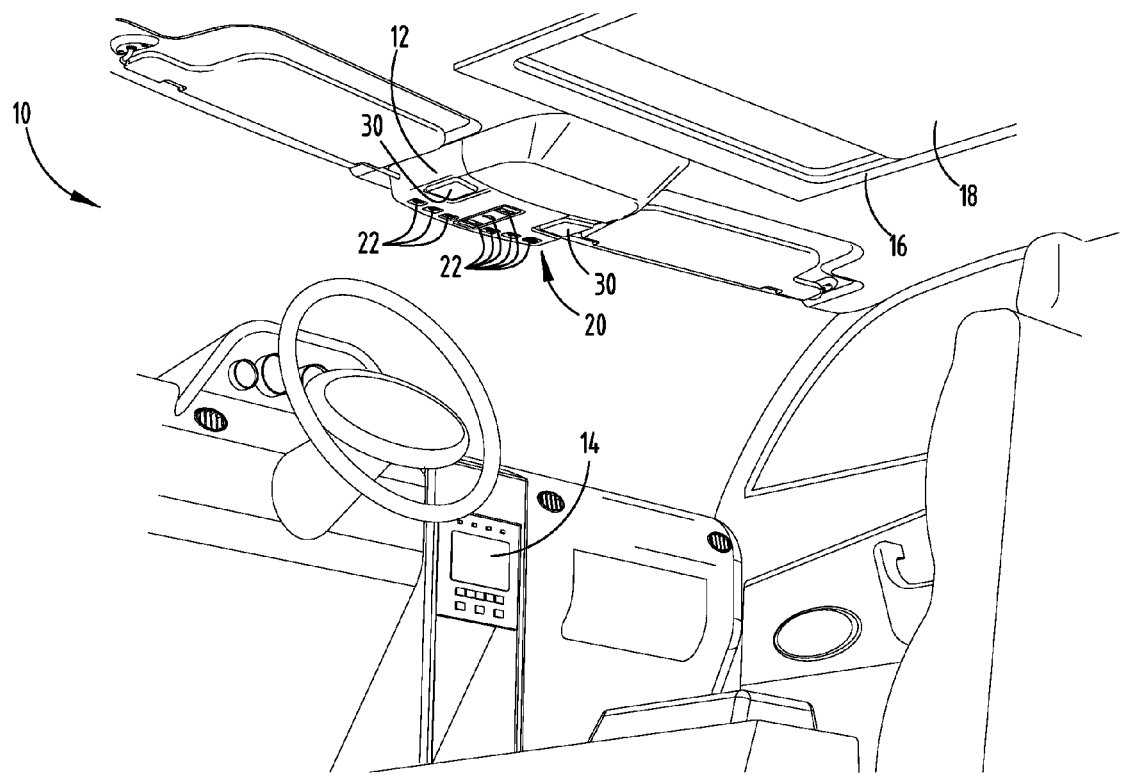
FIG. 1 is a perspective view of a passenger compartment of an automotive vehicle having an overhead console employing a proximity switch assembly, according to one embodiment.
Figure 2:
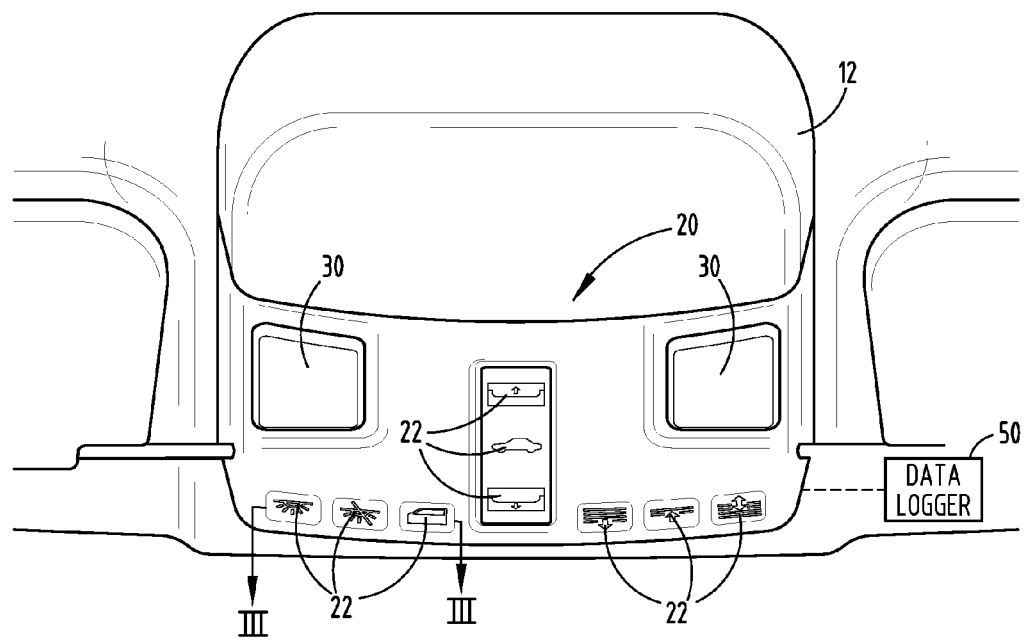
FIG. 2 is an enlarged view of the overhead console and proximity switch assembly shown in FIG. 1 and further coupled to a data logger for user testing.

Referring to FIGS. 1 and 2, the interior of an automotive vehicle 10 is generally illustrated having a proximity sensor interface in the passenger compartment referred to as a proximity switch assembly 20 having a plurality of proximity switches 22 with switch activation monitoring and determination, according to one embodiment. The vehicle 10 generally includes an overhead console 12 assembled to the headliner on the underside of the roof or ceiling at the top of the vehicle passenger compartment, generally above the front passenger seating area. The switch assembly 20 has a plurality of proximity switches 22 arranged close to one another in the overhead console 12, according to one embodiment. The various proximity switches 22 may control any of a number of vehicle devices and functions, such as controlling movement of a sunroof or moonroof 16, controlling movement of a moonroof shade 18, controlling activation of one or more lighting devices such as interior map/reading and dome lights 30, and various other devices and functions. However, it should be appreciated that the proximity switches 22 may be located elsewhere on the vehicle 10, such as in the dash panel, on other consoles such as a center console, integrated into a touch screen display 14 for a radio or infotainment system such as a navigation and/or audio display, or located elsewhere onboard the vehicle 10 to enable user interfacing, according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a user in relation to the one or proximity sensors, such as a swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIGS. 1 and 2 each provide control of a vehicle component or device or provide a designated control function. One or more of the proximity switches 22 may be dedicated to controlling movement of a sunroof or moonroof 16 to cause the moonroof 16 to move in an open or closed direction, tilt the moonroof, or stop movement of the moonroof based upon a control algorithm. One or more other proximity switches 22 may be dedicated to controlling movement of a moonroof shade 18 between open and closed positions. Each of the moonroof 16 and shade 18 may be actuated by an electric motor in response to actuation of the corresponding proximity switch 22. Other proximity switches 22 may be dedicated to controlling other devices, such as turning an interior map/reading light 30 on, turning an interior map/reading light 30 off, turning a dome lamp on or off, unlocking a trunk, opening a rear hatch, or defeating a door light switch. Additional controls via the proximity switches 22 may include actuating door power windows up and down. Various other vehicle controls may be controlled by way of the proximity switches 22 described herein.

Figure 3:
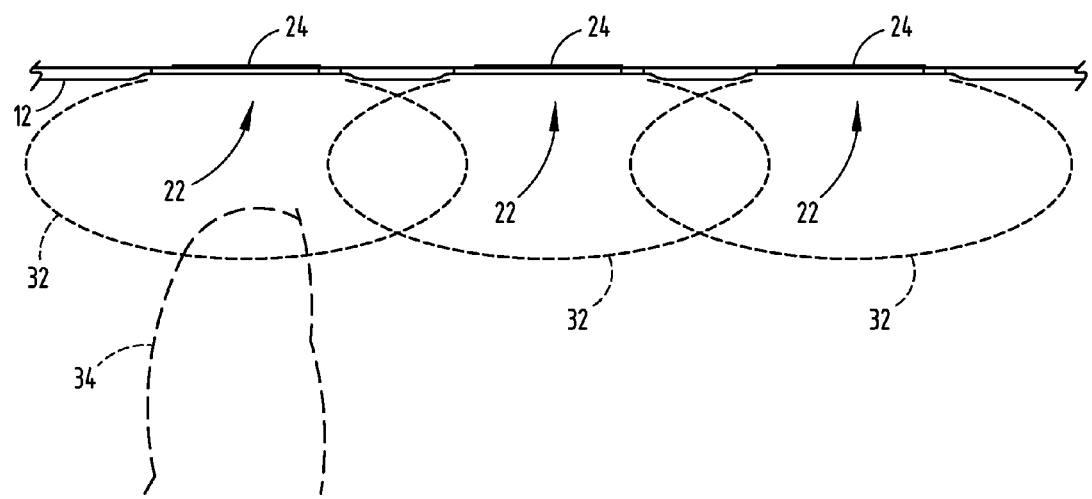
FIG. 3 is an enlarged cross-sectional view taken through line III-III in FIG. 2 showing an array of proximity switches in relation to a user's finger.
Figure 4:
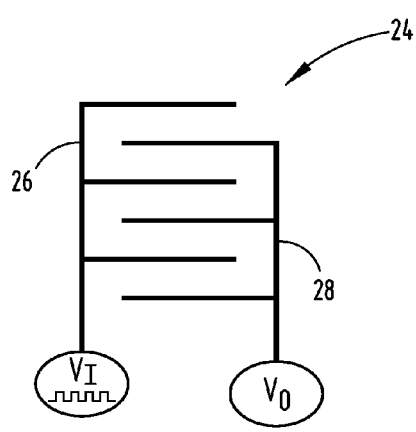
FIG. 4 is a schematic diagram of a capacitive sensor employed in each of the capacitive switches shown in FIG. 3.

Referring to FIG. 3, a portion of the proximity switch assembly 20 is illustrated having an array of three serially arranged proximity switches 22 in close relation to one another in relation to a user's finger 34 during use of the switch assembly 20. Each proximity switch 22 includes one or more proximity sensors 24 for generating a sense activation field. According to one embodiment, each of the proximity sensors 24 may be formed by printing conductive ink onto the top surface of the polymeric overhead console 12. One example of a printed ink proximity sensor 24 is shown in FIG. 4 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. In the embodiment shown, adjacent sense activation fields 32 generated by adjacent proximity switches 22 overlap slightly, however, overlap may not exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. The determination of whether the disturbance is sufficient to activate a switch may include comparing a sensed signal generated in response to the activation field to one or more threshold values, threshold rates, or other known switch activation detection techniques. Additionally, the disturbance to the activation field may be processed to determine whether a user is hunting or exploring the switches or performing a swipe or other gesture as an input. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed.

Figure 5:
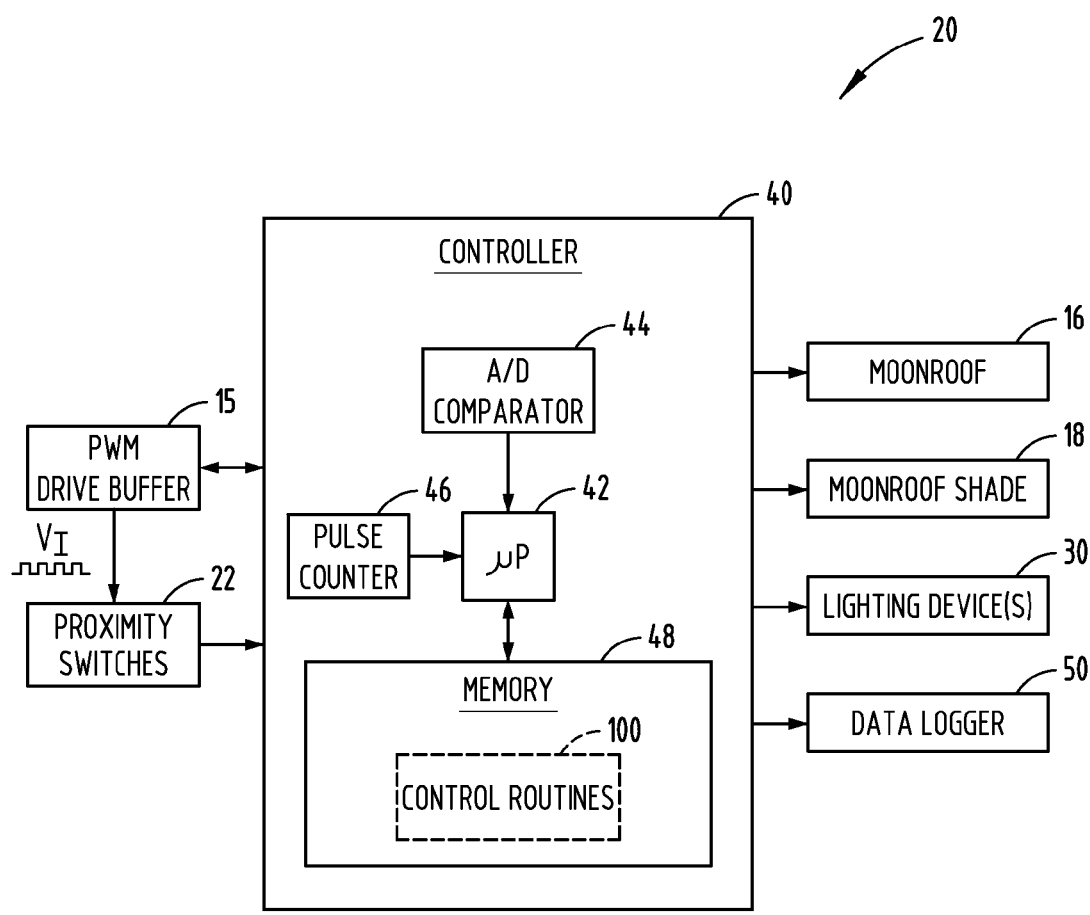
FIG. 5 is a block diagram illustrating the proximity switch assembly, according to one embodiment.

Referring to FIG. 5, the proximity switch assembly 20 is illustrated according to one embodiment. A plurality of proximity sensors 24 are shown providing inputs to a controller 40, such as a microcontroller. The controller 40 may include control circuitry, such as a microprocessor 42 and memory 48. The control circuitry may include sense control circuitry processing the activation field of each sensor 22 to sense user activation of the corresponding switch by comparing the activation field generated signal to one or more thresholds and/or rate values pursuant to one or more control routines. It should be appreciated that other analog and/or digital control circuitry may be employed to process each activation field, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to correct activation of a proximity switch. For example, the one or more devices may include a moonroof 16 having a motor to move the moonroof panel between open and closed and tilt positions, a moonroof shade 18 that moves between open and closed positions, and lighting devices 30 that may be turned on and off. Other devices may be controlled such as a radio for performing on and off functions, volume control, scanning, and other types of devices for performing other dedicated functions. One of the proximity switches 22 may be dedicated to actuating the moonroof closed, another proximity switch 22 may be dedicated to actuating the moonroof open, and a further switch 22 may be dedicated to actuating the moonroof to a tilt position, all of which would cause a motor to move the moonroof to a desired position. The moonroof shade 18 may be opened in response to one proximity switch 22 and may be closed responsive to another proximity switch 22.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines 100 stored in memory to monitor and make a determination as to activation of one of the proximity switches. The control routines 100 may include a routine for executing a method of activating the proximity switches using known detection techniques such as comparing the generated signals to one or more threshold values, and/or threshold rates.

The proximity switch assembly 20 may generate a change in sensor charge pulse counts, also referred to as Δ sensor counts, for a plurality of signal channels associated with a plurality of proximity switches. The change in sensor charge pulse count is the difference between an initialized reference count value without any finger or other object present in the activation field and the corresponding sensor reading. When a user's finger is in contact with or close proximity of a sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode 28 to a known voltage potential. The cycle is repeated until the voltage across the measurement capacitor reaches a predetermined voltage. Placing a user's finger on the touch surface of the switch 24 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading. It should be appreciated that other sensor acquisition and detection techniques may be employed in other proximity sensor interfaces.

The proximity sensor interface may employ any of a number of known techniques for monitoring a sensed signal in response to one or more proximity sensors and detecting activation of a switch. One example of a proximity monitoring and determination technique is disclosed in U.S. patent application Ser. No. 13/721,886 filed on Dec. 20, 2012 entitled "PROXIMITY SWITCH ASSEMBLY AND ACTIVATION METHOD USING RATE MONITORING," which discloses the use of thresholds and a rate monitoring routine to determine valid switch activations. The aforementioned patent application is hereby incorporated herein by reference. It should be appreciated that other sensor monitoring and activation determining techniques may be employed in the proximity sensor interface that is simulated and analyzed for testing by the development system disclosed herein.

A proximity sensor interface development system is employed to test and help develop proximity interface sensors, such as the proximity switch assembly 20 and other proximity sensor interfaces that include proximity and/or gesture recognition interfaces. During the development of such sensor interfaces, it is frequently necessary to modify or write new software applications to eliminate or compensate for potential failures and other limitations. For example, changes made to the software such as changing a tuning parameter like the threshold value used to determine switch activation, or such as changing sensitivity of one or more sensors, or such as adding new modules like a routine to compensate for condensation, would typically require performing a full set of environmental tests as well as a full-blown customer clinic to properly test the newly programmed assembly. The present proximity sensor interface development system advantageously enables the testing and assisted development of proximity sensor interfaces with new software or changes to software in a manner that significantly reduces the expense and time to confirm proper operation and optimal performance without requiring time consuming repeated environmental testing and customer clinics.

The proximity interface development system collects or receives a data log which may be acquired from a full set of environmental tests and/or a customer clinic typically employing many potential operators that may activate the various proximity switches by pressing on switches, perform certain gestures, and perform various other user input proximity sensor interface actions. These data logs may be acquired by employing the proximity switch assembly 20 shown in FIGS. 1-5, according to one example. In doing so, the proximity switch assembly 20 may be installed within a vehicle as shown in FIG. 1, or may be installed within an environmental testing chamber in which environmental conditions, such as temperature, humidity and other factors may be controlled and varied. A data logger 50 may be coupled to the proximity switch assembly 20 as shown in FIGS. 2 and 5 during the customer clinic to record the data used to generate the data log. The data log stored within data logger 50 may include typical activation data as sensed by the various sensors of the assembly 20 while various operators interface with the proximity switch assembly 20. The data collected may include unprocessed hardware sensor outputs and the time stamp. During the test, certain software routines are executed by the proximity switches. The data log records the various sensor inputs and employs the data for use in testing changes to the software or alternative software such that the full-blown customer clinic need not be repeated each time a software change is made to the proximity switch assembly.

Figure 6:
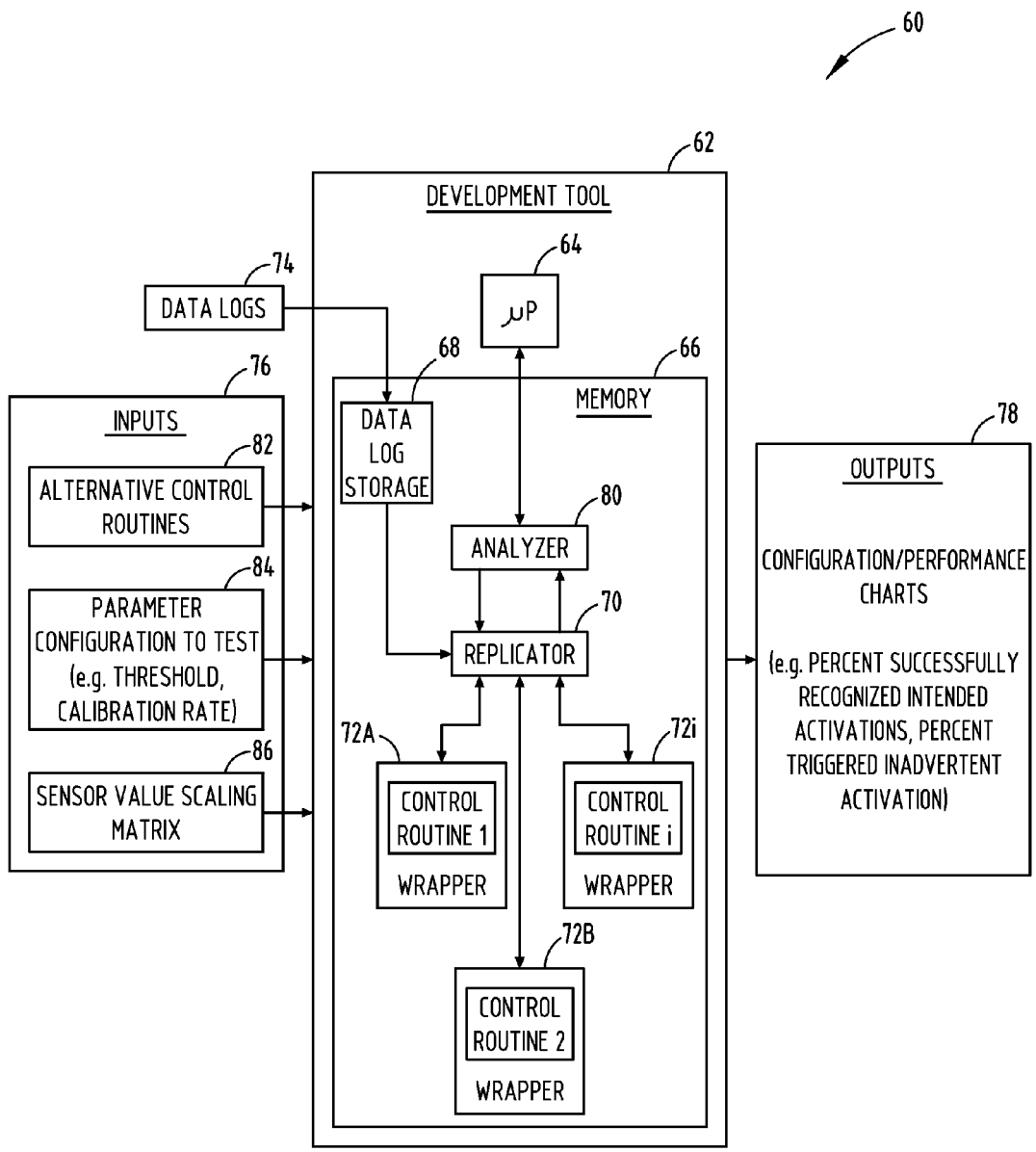
FIG. 6 is a block diagram illustrating a development system employing a replicator and analyzer as a tool for developing the proximity switches, according to one embodiment.
Figure 7:
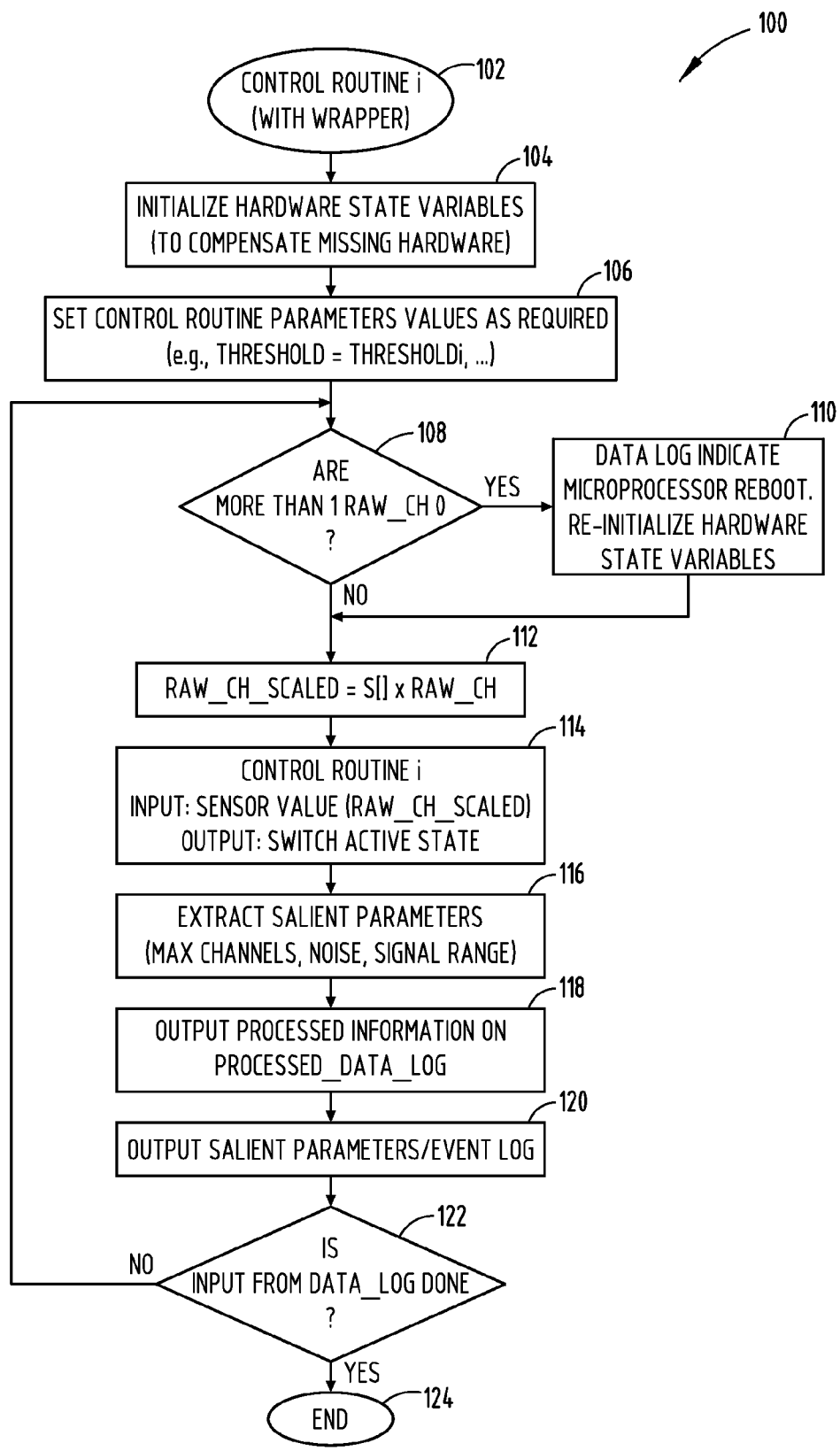
FIG. 7 is a flow diagram illustrating a control routine with wrapper operated by the development system, according to one embodiment.

Referring to FIG. 6, the proximity interface development system 60 is illustrated, according to one embodiment. The proximity interface development system 60 includes a development tool 62 having a microprocessor 64 and memory 66. The development tool 62 may include a dedicated processing machine capable of processing proximity sensor interface software routines and the data log to replicate operation of the software on a proximity sensor interface and to analyze the data generated during the replication to provide performance outputs. The development tool 62 may include a computer programmed to perform the functionality, as described herein, according to one embodiment.

The proximity interface development system 60 receives one or more data logs from input 74 and stores the data log in data log storage 68 of memory 66. Additionally, a plurality of control routines 72A-72I may be stored in memory 66. The control routines 72A-72I are software routines that are designed to operate a proximity sensor interface, such as a proximity switch assembly but include a wrapper to process data without the proximity switch hardware. The software routines 72A-72I may be the same software configured to operate on a proximity switch assembly and may include additional code to enable execution without the hardware. Variations of the software of control routines 72A-72I may include changes to the software or alternative software that may be stored in memory 66 and processed by the development tool 62. The development tool 62 receives various other inputs 76 including alternative control routines 82 which may include changes to the software programs which are intended to be tested by the proximity interface development system 60. Other inputs include parameter configurations to test 84 such as threshold values, calibration rate values, rate monitoring threshold, signature ratios, number of active channels, time period required for a stable signal, ranges for stable signal, and other parameters. Further inputs include sensor value scaling matrixes 86 which may include multiplication factors to tune or adjust sensitivities of sensors. The development tool 62 generates outputs 78 which include configuration/performance charts such as the percent successfully recognized intended activations, percent triggered inadvertent activations, type of activations, type of not recognized activations, score rating data, and other performance data.

The proximity interface development system 60 includes a replicator 70, shown stored in memory 66 and executed by microprocessor 64. The replicator 70 replicates or simulates the proximity sensor interface based on the control routines, including software changes and alternative control routines, and determines outputs of the proximity sensor interface that are analyzed to determine proper or optimal operation of the software as it is expected to operate on the proximity sensor interface. The replicator 70 processes the data log generated during environmental testing, such as data acquired in a customer clinic, through the actual source code used in the production unit of the proximity sensor interface without the need for physical hardware associated with the interface. The replicator 70 processes inputs which include the capacitive sensor readings from the data log and generates outputs which include triggering decisions, such as whether or not a user intends to activate a switch. The software used in the replicator 70 may be identical to the production code used in the proximity sensor interface, such that the output from the replicator 70 would match the data presented in the data log for the identical software control routine. When a change is made to the software code, such as the addition of a new module or the tuning of a parameter, the replicator output generated by the proximity interface development system predicts with certainty what would occur in the actual production part using the new software code, as if the test were actually performed using the actual hardware in an environmental chamber and/or using customer clinics. By using the replicator 70, the effect of any software code changes can be tested on a previously collected data log in almost no time.

The proximity interface development system 60 further includes an analyzer 80 shown stored in memory 66 and executable by microprocessor 64. The analyzer 80 post-processes the data generated by the replicator 70 to determine whether intended activations of proximity switches were missed (e.g., the operator attempted to activate a switch to open the roof, but nothing happened), or unwanted activations were triggered (e.g., the operator was moving the hand close to the interface reaching for the overhead glasses compartment and a switch was inadvertently triggered). When a large number of customer data samples are collected, hand processing the data is time-consuming and prone to error. The analyzer 80 automatically processes the data output from the replicator 70 in a manner that is accurate and much less time-consuming.

Referring to FIGS. 7-12, a control routine 100 with wrapper used by the replicator 70 is illustrated, according to one embodiment. Routine 100 begins at step 102 and proceeds to step 104 to initialize hardware state variables to compensate for hardware associated with the proximity sensor interface but not implemented during testing with the development system. The control routine 100 is software code that may include an exact replica of the software running on the actual production hardware components, with embedded extra code in the form of the software analyzer to provide additional information about the system behavior. The control routine 100 is processed with various inputs such as sensor values including raw channel signals from the data log, parameter values to be tested including thresholds, and rate values, and scaling matrixes. The control routine 100 software generates outputs based on the data log as if it would have been generated if running a test on the production part, and additionally generates salient parameters and event logs.

Routine 100 includes step 106 which sets the control routine parameters values as required, such as, for example, setting a threshold equal to threshold i. This sets the new values of the control routine parameters that will be tested for performance, such as, for example, what would happen if a threshold is lowered or if a calibration rate is increased. Next, at decision step 108, routine 100 determines if there is more than one raw channel set equal to zero. If more than one raw sensor value is set equal to zero in the data log, this means that a reset occurred in the hardware as the data log was collected. When this happens, the hardware state variables are reinitialized. Next, at step 112, routine 100 scales the raw values to simulate increased/decreased sensitivity by multiplying the raw channel signal by scaling matrix S[ ]. In one embodiment, the scaling matrix may be linear. However, it should be appreciated that the scaling matrix may be a negative exponential or logarithmic value or may otherwise be defined by another function or equation. By adjusting the scaling matrix, a multiplier may be used to simulate a change in software such as a change in sensor sensitivity and the effect thereof on the proximity sensor interface may be tested by the development system.

Proceeding to step 114, routine 100 runs the control routine i code which is a copy of the actual code that is run on the production sensor interface assembly. The control routine is executed with inputs which include a sensor value, such as a raw channel scaled value, and outputs such as the switch active state. As such, the software code may be executed and tested without hardware, while providing the same outputs as if the code had been run on the actual production assembly. Routine 100 then proceeds to step 116 to extract salient parameters such as maximum signal channels, noise and signal range, maximum rate, second maximum channel, the number of active channels above an active threshold, ratio (max/sum) maximum ratio, maximum peak of other parameters Thus, key events and parameters are extracted, which may be used as inputs to the analyzer. Next, at step 118, the code running on the replicator outputs the processed information on the processed data log on a dedicated interface. This module sends the log directly to a file, which is used as an input to the analyzer. At step 120, routine 100 outputs the salient parameter/event log which contains processed information regarding the signal, such as the maximum signal during an event, signal range, etc. Next, at decision step 122, routine 100 determines if the input from the data log is complete processed (done) and, if so, ends at step 124. Otherwise, routine 100 returns to step 108.

Figure 8:
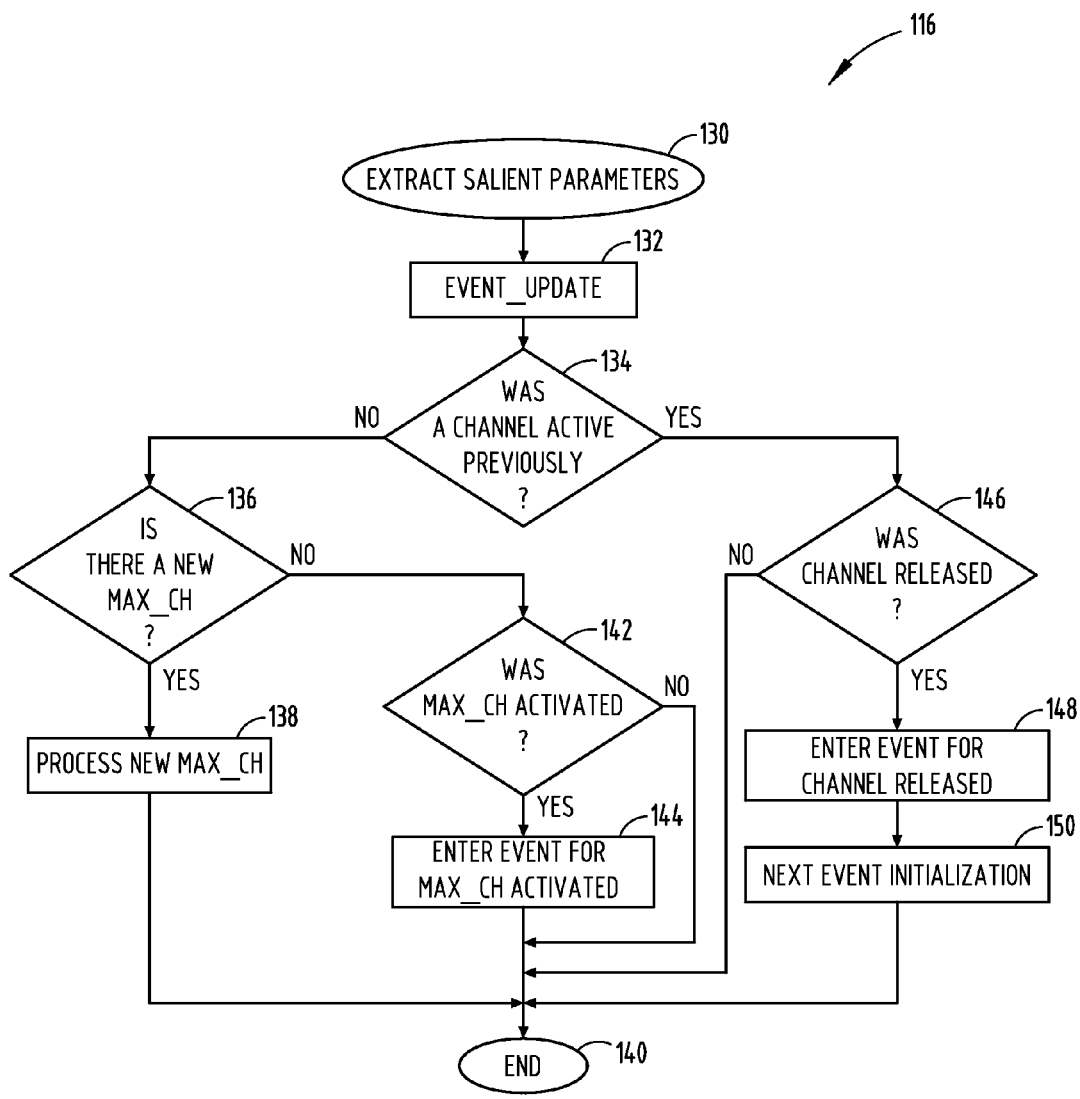
FIG. 8 is a flow diagram illustrating the extract salient parameters subroutine of FIG. 7.

Referring to FIG. 8, the extract salient features subroutine of step 116 is further illustrated beginning at step 130 and proceeding to perform an event update at step 132. The event update step 132 is shown and described in connection with a subroutine shown in FIG. 9. Following the event update, routine 116 proceeds to decision step 134 to determine if a signal channel was active previously and, if not, proceeds to decision step 136. At decision step 136, routine 116 determines if there is a new maximum channel and, if so, processes the new maximum channel at step 130 before ending at step 140. If there is not a new maximum channel, routine 116 proceeds to decision step 142 to determine if the maximum channel was activated and, if so, enters the event for the maximum channel activated the step 144 before ending at step 140. If a channel was determined in step 134 to be active previously, routine 116 proceeds to decision step 146 to determine if the channel was released and, if not, ends at step 140. If the channel was released, routine 116 enters the event for the current channel release at step 148, and then proceeds to step 150 to set the next event initialization before ending at step 140.

Figure 9:
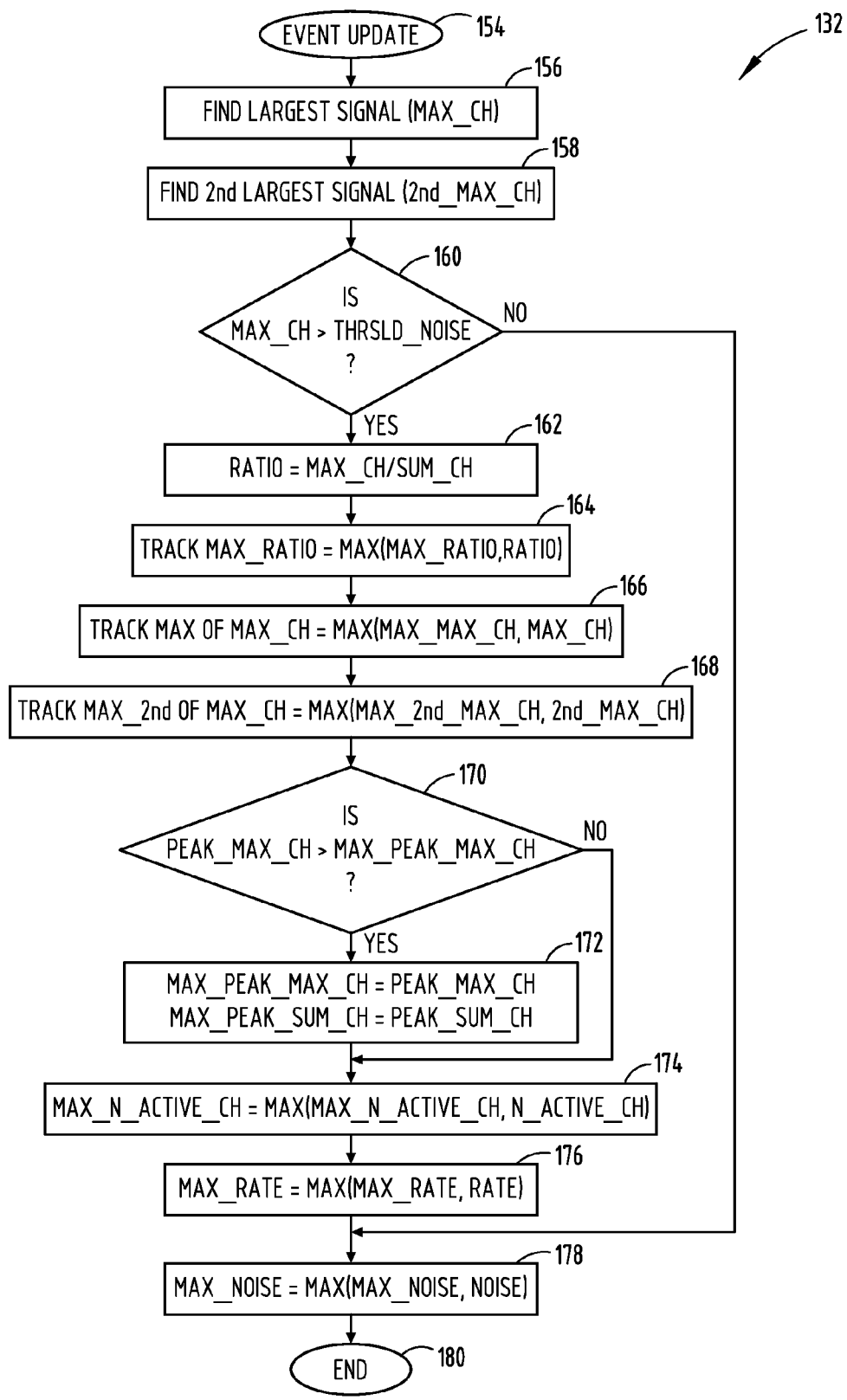
FIG. 9 is a flow diagram illustrating the event update subroutine of FIG. 8.

The event update subroutine 132 is illustrated in FIG. 9, beginning at step 154 and proceeding to step 156 to find the largest signal (max_channel), and then to step 158 to find the second largest signal (second_max_channel). Next, routine 132 proceeds to decision step 160 to determine if the maximum channel is greater than a threshold noise and, if so, sets a ratio equal to the maximum channel divided by the sum channel at step 162. The sum channel is a summation of all signal channels associated with the proximity sensor interface. Thereafter, routine 132 proceeds to step 164 to update the maximum observed ratio with the current ratio value if this is greater than the current maximum observed ratio. Next, at step 166, the maximum observed max_ch is updated with the current max_ch if this is greater. Thereafter, at step 168, the maximum observed second largest channel is updated with the current second largest channel if this is greater. Routine 132 then proceeds to decision step 170 to determine if the peak maximum channel is greater than the maximum peak maximum channel and, if so, proceeds to step 172 to set the maximum peak maximum channel equal to peak maximum channel and to set the maximum peak sum channel equal to the peak sum channel. Following step 172 or the negative decision of step 170, routine 132 proceeds to step 174 to set the maximum number (N) of active channels equal to the maximum max_number of active channel (N_active_ch). Thereafter, at step 176, the maximum observed rate is set equal to the current rate if this is greater. The maximum observed noise is then compared to the current noise and the maximum noise is set equal to the current noise if this is greater at step 178 before ending at step 180. If the maximum channel is not greater than the noise threshold in decision step 160, routine 130 proceeds directly to step 178 to update the maximum observed noise before ending at step 180.

Figure 10:
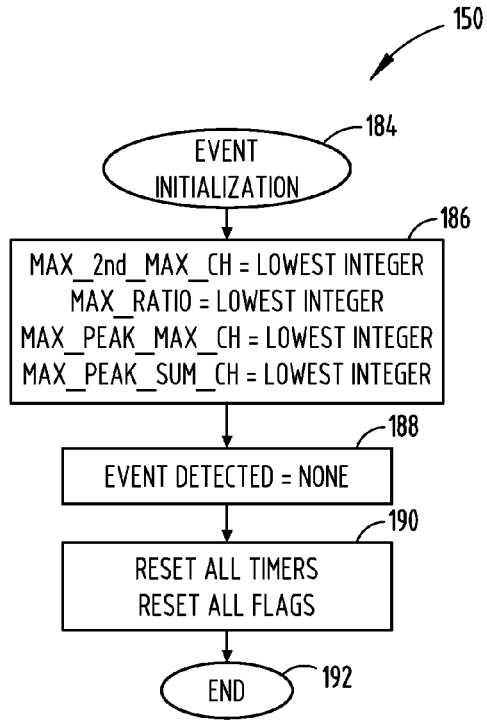
FIG. 10 is a flow diagram illustrating the event initialization subroutine of FIG. 8.

The event initialization subroutine 150 is illustrated in FIG. 10. Routine 150 begins at step 184 and proceeds to step 186 to set the maximum second maximum channel equal to the lowest integer available for that variable, to set the maximum ratio equal to the lowest integer available for that variable, to set the maximum peak maximum channel equal to the lowest integer available for that variable and to set the maximum peak sum channel equal to the lowest integer. The event detected is then set equal to none at step 188. Next, routine 150 proceeds to step 190 to reset all timers and to reset all flags before ending at step 192.

Figure 11:
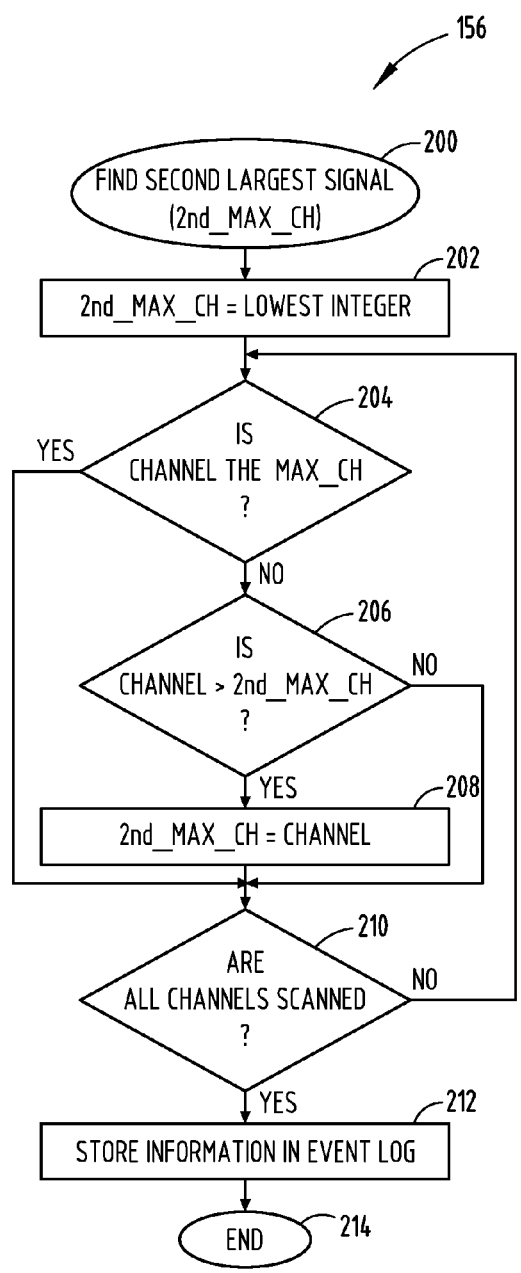
FIG. 11 is a flow diagram illustrating the subroutine for finding the second largest signal of FIG. 9.

The subroutine 156 defining the second largest signal (second max channel) is illustrated in FIG. 11 beginning at step 200 and proceeding to step 202 to set the second maximum channel equal to the lowest integer. Next, routine 156 proceeds to decision step 204 to determine if the channel is the max channel and, if so, proceeds to decision step 210 to determine if all channels are scanned and, if so, stores the information in the event log at step 212 before ending at step

214. If all channels are not scanned as determined by decision step 210, routine 156 returns to step 204. At step 204, if the current channel is not the max channel, routine 156 proceeds to decision block 206 to determine if the channel is greater than the second maximum channel and, if so, sets the second maximum channel equal to the current channel at step 208, before proceeding to decision step 210. If the current channel is not greater than the next channel in decision step 206, routine 156 jumps forward to decision step 210.

Figure 12:
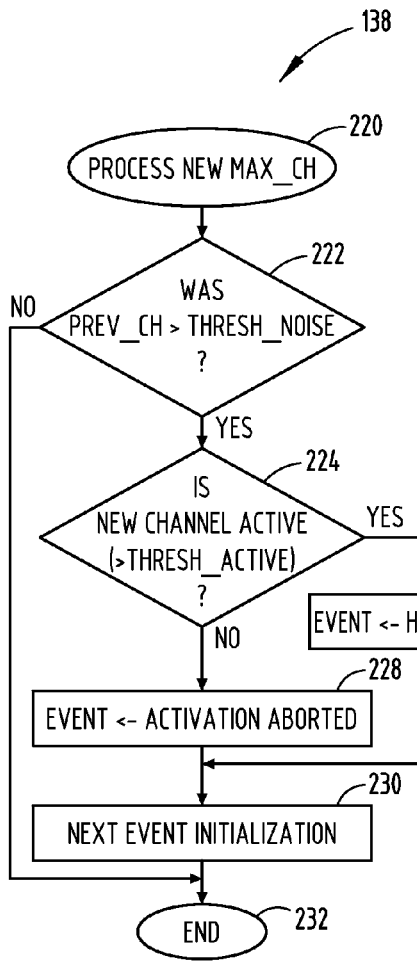
FIG. 12 is a flow diagram illustrating the process new max channel subroutine of FIG. 8.

The process new max channel subroutine 138 is shown in FIG. 12 beginning at step 220 and proceeding to decision step 222 to determine if the previous channel was greater than the threshold noise and, if not, ends at step 232. If the previous channel was greater than the threshold noise, routine 138 proceeds to decision step 224 to determine if the new channel is active, which may be determined by a new channel being greater than a threshold active value. If the new channel is not active, routine 138 proceeds to set the event equal to activation aborted at step 228 and to set the next event initialization at step 230 before ending at step 232. If the new channel was determined to be active at step 224, routine 138 sets the event to event hunting at step 226 before proceeding to step 230.

The software replicator may be implemented as an activation detection module as an exact replica of the software running on the actual production hardware component. The replicator may be embedded with additional software code referred to as the software analyzer to provide information to a developer about the system behavior. As a comprehensive customer clinic is run on a hardware implementation, the full sensor signal log is collected and the data log can be used as an input to the software replicator, implemented using the same source code running on the actual hardware sensor interface module. Parameters in the software can quickly be changed as needed and tested in the replicator. The activation log is collected and matched against the desired outcome, using the difference ($\Delta$) between desired and actual activations in addition to the number of unintended activations as two quality metrics. Additionally, the sensor data log can be preprocessed through a signal amplifier to simulate boards with higher or lower sensitivity, sensor boards with more or less cross-talk between channels, or sensor boards with the same layout but with redesigned individual switches having either different pad sizes or templates. The activation detection in the software replicator processes the modified data log to predict what the effect of these changes would be on the physical hardware, such that a full clinic's worth of data can be quickly processed. A proper sensor pad design can be quickly selected, the software parameters optimally tuned, and the robustness of the proximity sensor interface to manufacturing variability quickly accessed.

In lieu of using collected sensor log data, the actual operator hand posture log data may be fed into a software model of the actual hardware module to generate the data log, according to another embodiment. Thus, software model may predict what the sensor response would be. The hand motion log can be collected from an actual clinic or generated using one of the available human modeling packages.

Figure 13:
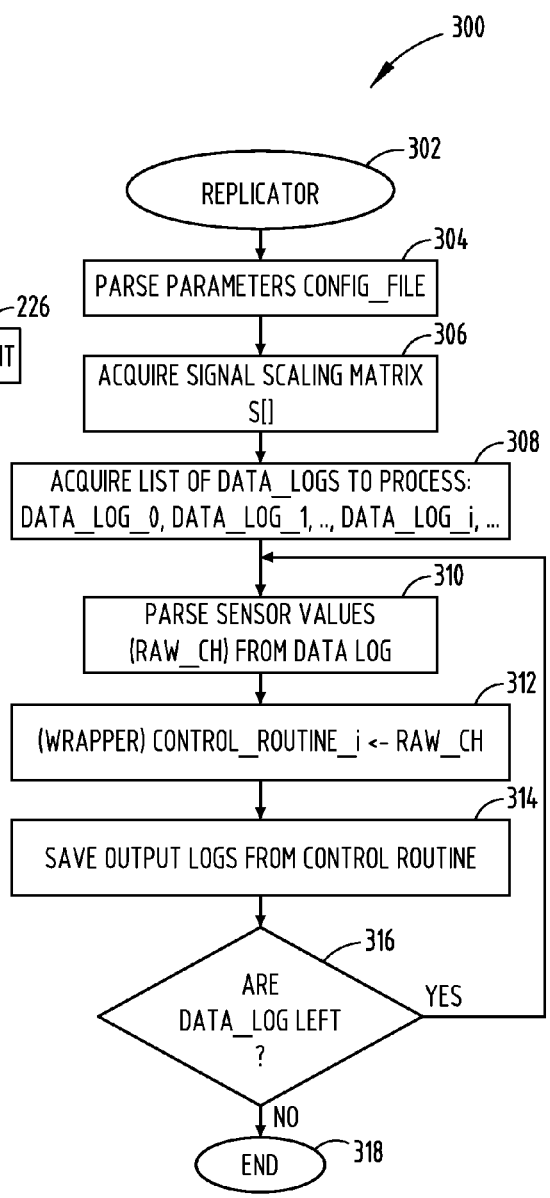
FIG. 13 is a flow diagram illustrating the replicator routine, according to one embodiment.

The replicator routine 300 is illustrated in FIGS. 13-16, according to one embodiment. Referring to FIG. 13, the replicator routine 300 begins at step 302 and proceeds to step 304 to parse the configuration file. Next, at step 306, routine 300 acquires the signal scaling matrix S[ ], and proceeds to step 308 to acquire a list of data logs to process, such as data log 0, data log 1, data log i. The inputs to the replicator may be sent as a template text file, such as a set of instructions, and steps 304, 306 and 308 are utilized to parse through these files. It should be appreciated that various inputs are provided to the replicator including a configuration to analyze the data logs. The configuration to analyze may include control routines to be tested, parameter configurations to test such as, for example, thresholds and calibration rates, and sensor value scaling matrixes such as a scaling matrix to multiple sensor raw values from the data log.

The replicator routine 300 parses the sensor values at step 310. The data log may contain information that is not relevant to the replicator and, as such, this routine may identify which data is the raw sensor value data to use as an input to the replicator. Next, at step 312, routine 300 performs the wrapper control routine. In doing so, the raw sensor values from the data log are sent to the control routine. The routine has a wrapper that performs tasks that would otherwise be done by hardware modules in the production assembly. Thus, the wrapper serves as an interface to replace lines of code that are hardware dependent with code that is hardware independent. Next, routine 300 proceeds to save the output logs from the control routine at step 314. Two output logs may be saved to storage including a processed data log which is the data log as it would have been generated if running a test on a production sensor interface assembly, and a salient parameters/events log. Thereafter, routine 300 proceeds to decision step 316 to determine if there are any data logs left and, if so, returns to step 310. Otherwise, routine 300 ends at step 318.

Figure 14:
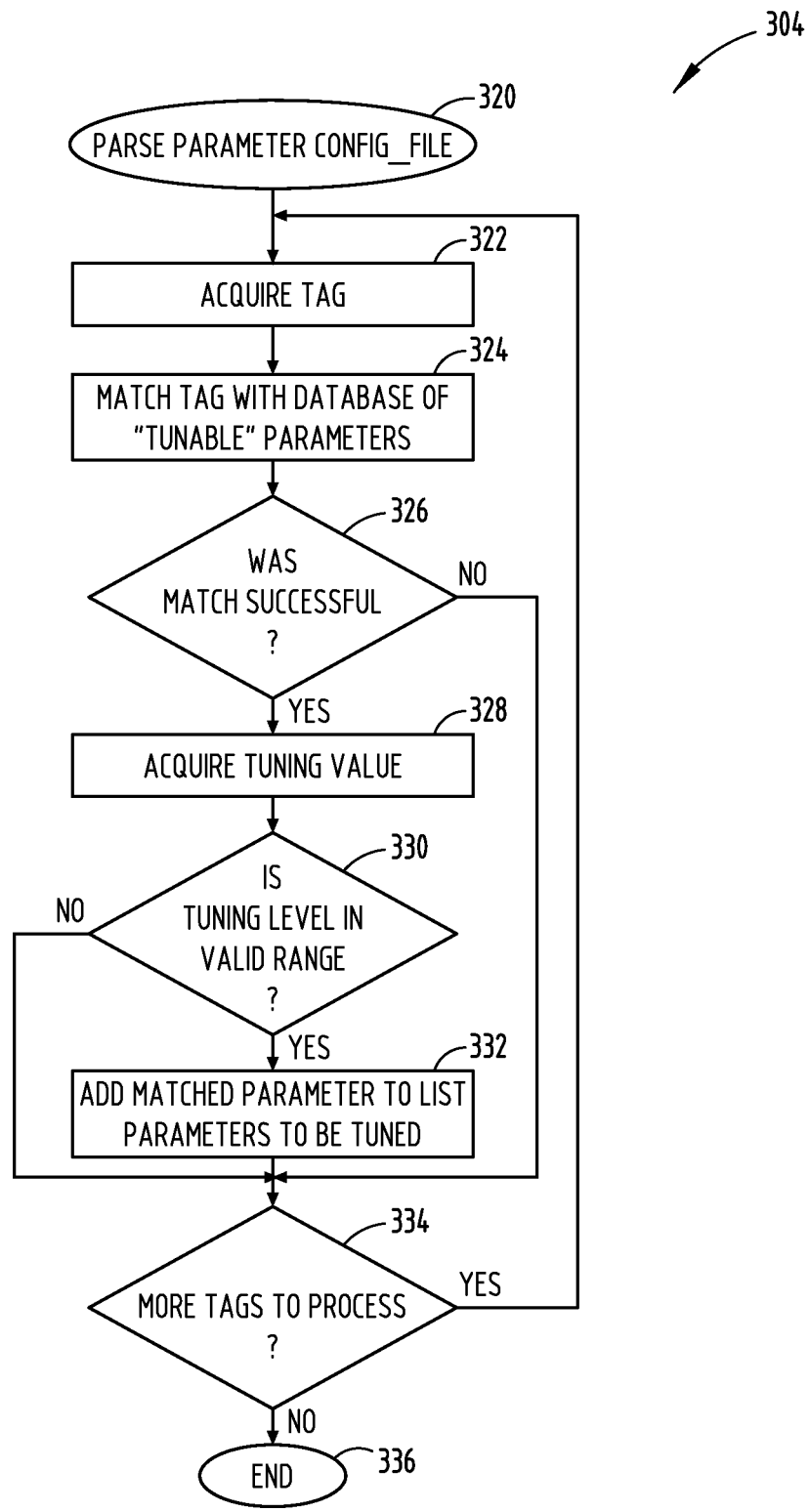
FIG. 14 is a flow diagram illustrating the parse parameter configuration subroutine of FIG. 13.

The parse parameter configuration file subroutine 304 is illustrated in FIG. 14. The parameter configuration file to initialize the replicator may be sent as a text file which ensures the replicator can be used as a separate tool. The text file may be parsed to acquire the list of parameters and their respective values. Beginning at step 320, routine 304 proceeds to step 322 to acquire a tag, and then to step 324 to match the tag with a database of tunable parameters. A tag is specific parameter identifier associated with a list of parameter values. Routine 304 determines at decision step 326 if a match was successful and, if so, proceeds to step 328 to acquire a tuning value. Next, at decision step 330, routine 304 determines if the tuning value is within a valid range and, if so, adds the matched parameter to a list of parameters to be tuned at step 322. If the match was not successful or if the tuning level is not within the valid range, routine 304 proceeds directly to decision step 334. At decision step 334, routine 304 determines if more tags are to be processed and, if so, returns to step 322. Otherwise, routine 304 ends at step 336.

Figure 15:
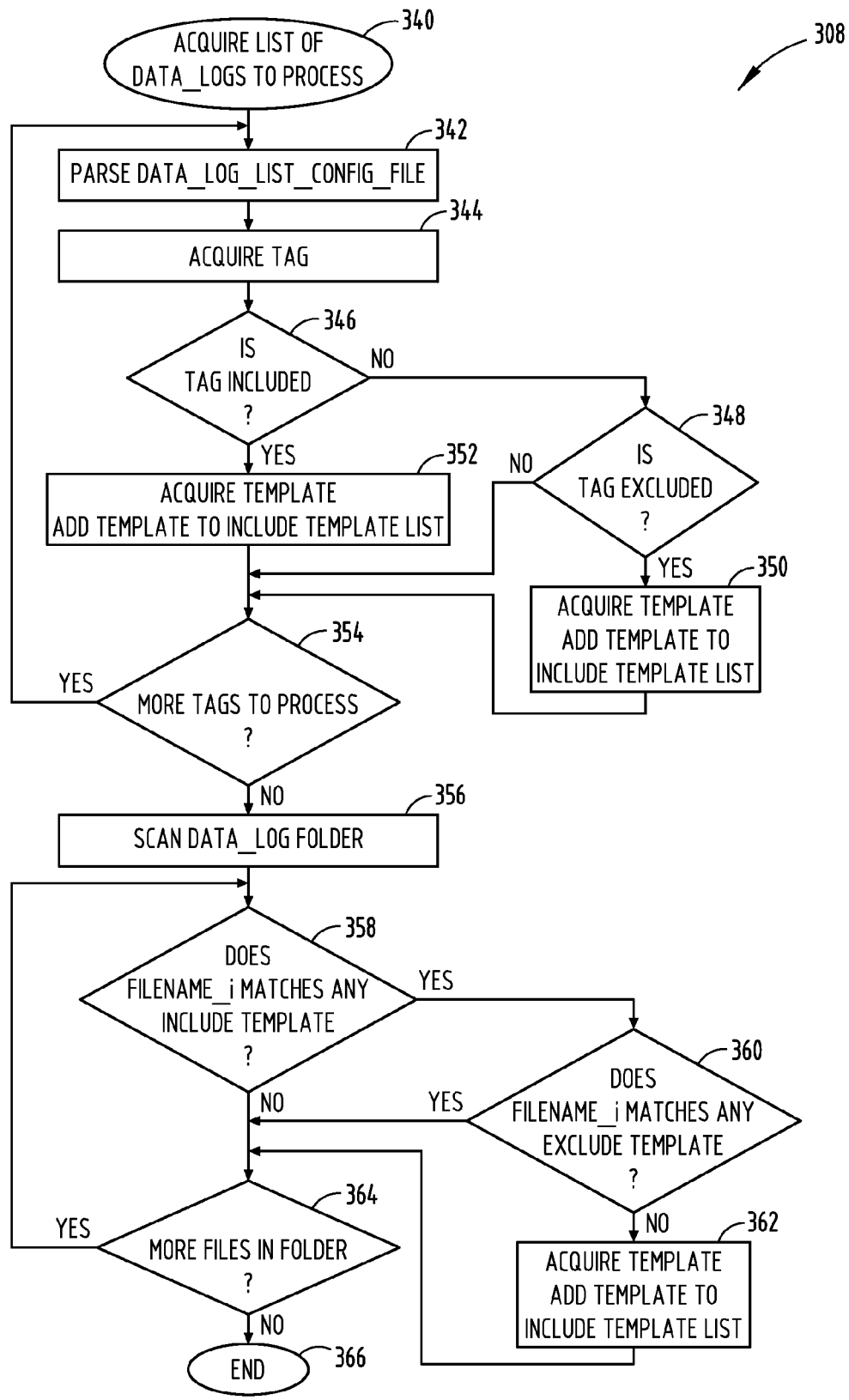
FIG. 15 is a flow diagram illustrating the acquire list of data logs to process subroutine of FIG. 13.

The acquire list of data logs to process subroutine 308 is illustrated in FIG. 15. The list of data log to be processed by the replicator may be sent as a text file which also ensures the replicator can be used as a separate tool, and the text file may be parsed to acquire the list. Routine 308 begins at step 340 and proceeds to step 342 to parse the data log list configuration file and then to step 344 to acquire a tag. At decision step 346, routine 308 determines if the tag is included and, if so, acquires a template and adds the template to include a template list at step 352. If the tag is not included, routine 308 proceeds to decision step 348 to determine if the tag is excluded and, if so, acquires a template and adds a template to exclude the template list at step 350. In any event, routine 308 proceeds to decision step 354 to determine if there are more tags to process and, if so, returns to step 342. If there are no more tags to process, routine 308 proceeds to step 356 to scan the data log folder and then to decision step 358 to determine if the file name i matches any include template and, if so, proceeds to decision step 360. At decision step 360, routine 308 determines if the file name i matches any exclude template and, if not, acquires a template to add the template to the include template list at step 336. In any event, routine 308 proceeds to decision step 364 to determine if there are more files in the folder and, if so, returns to step 358. Otherwise, step 308 ends at step 366.

Figure 16:
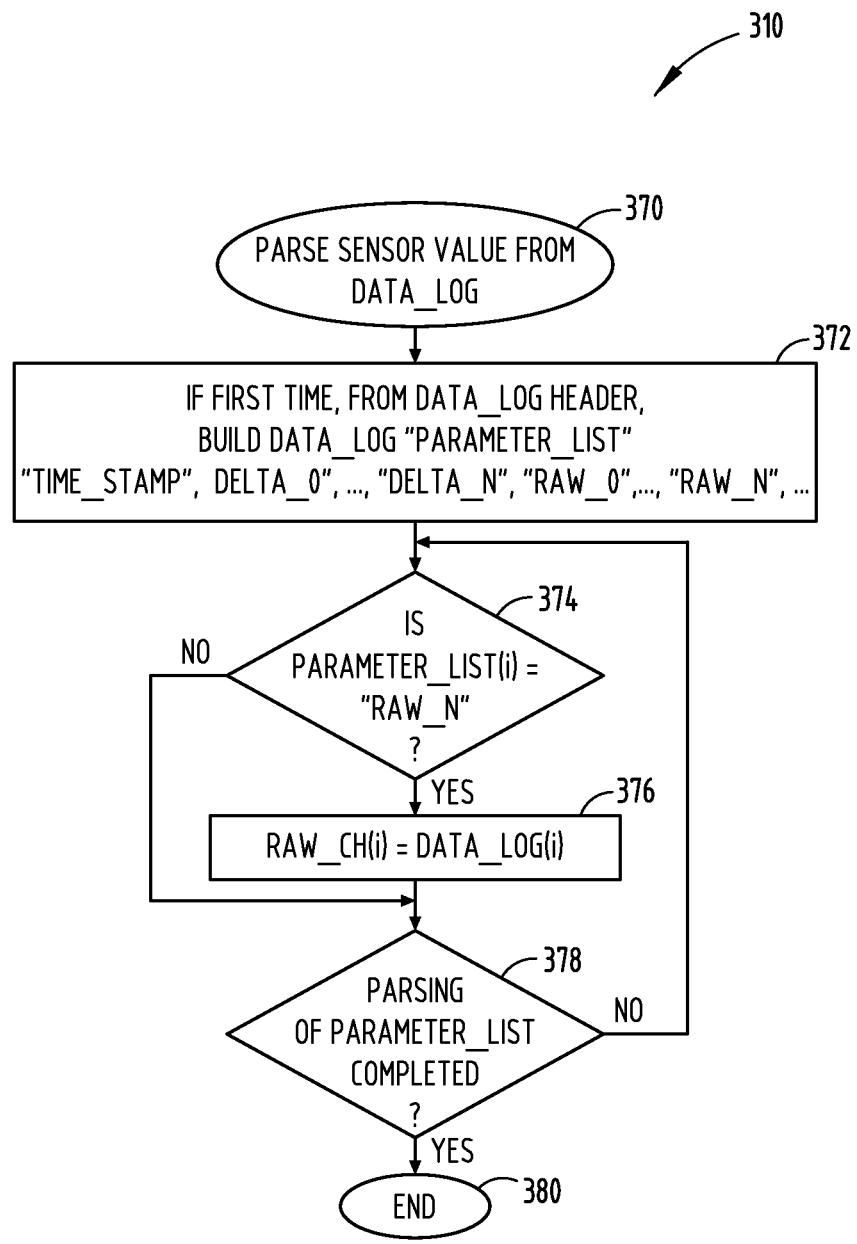
FIG. 16 is a flow diagram illustrating the parse sensor value from data log subroutine of FIG. 13.
Figure 17:
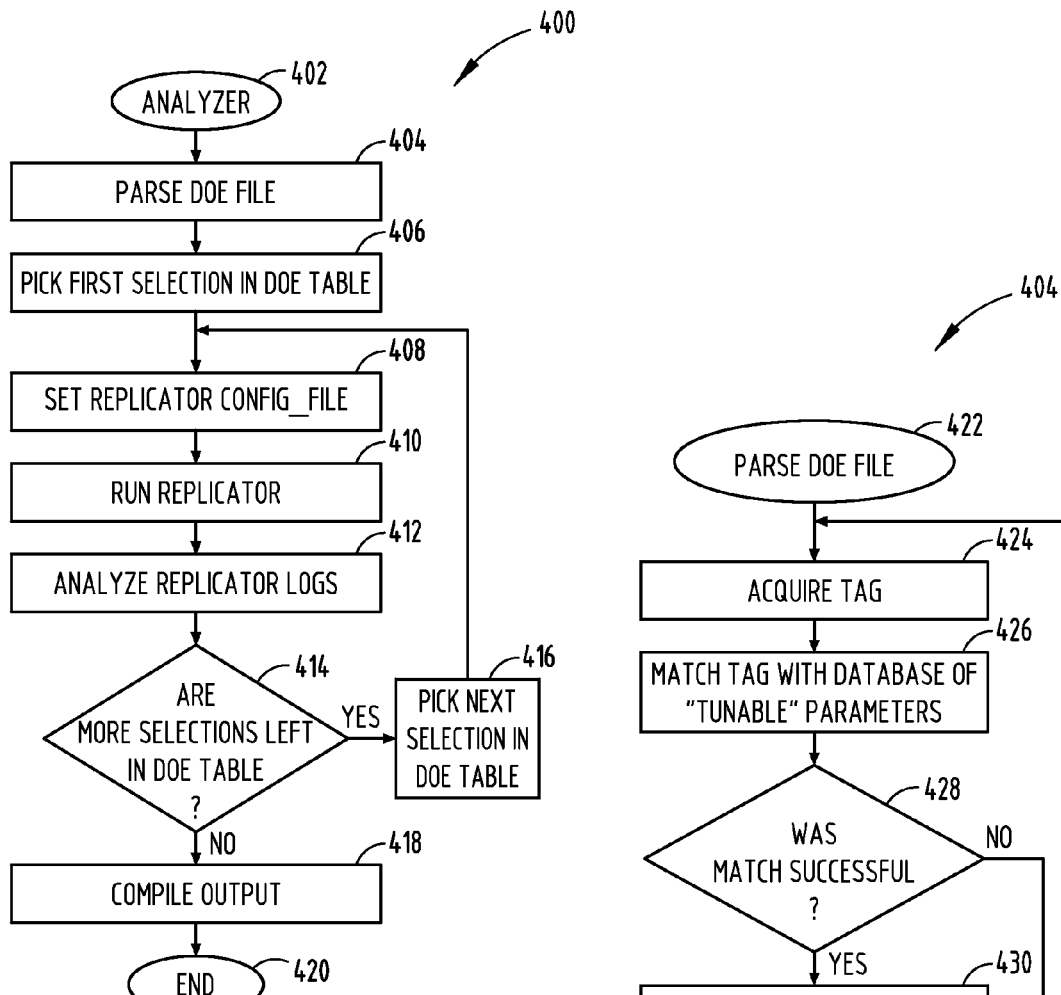
FIG. 17 is a flow diagram illustrating the analyzer routine, according to one embodiment.

The parse sensor value from data log subroutine 310 is illustrated in FIG. 16. The data log may contain information not relevant to the replicator, and as such, the routine 310 will identify which data is the raw sensor value data to use as an input to the replicator. Routine 310 begins at step 370 and proceeds to step 372 to, if this is the first time, build a data log parameter list, time stamp, Delta_0, Delta_N, Raw_N, from the data log header. Next, at decision step 374, routine 310 proceeds to determine if the parameter list (i) is set equal to Raw_N and, if so, sets the raw channel i equal to the data log i at step 376. If the parameter list i is not equal to Raw_N, routine 310 proceeds to decision step 378. At decision step 378, routine 310 determines if parsing of the parameter list is completed and, if not, returns to step 374. Otherwise, routine 310 ends at step 380.

Referring to FIGS. 17-20, the analyzer routine 400 is illustrated, according to one embodiment. The analyzer 400 receives inputs including the design of experiment (DOE). The DOE is the design of any information gathering exercise performed in a controlled experiment configuration to analyze and provides outputs including the configuration/performance charts. The inputs may include alternative control routines, the parameter configuration to test such as thresholds and calibration rates, and sensor value scaling matrix S [ ] as a scaling matrix to multiply sensor raw values from the data log and may include other parameters. The outputs may include percentage successfully recognized intended activations, percentage triggered inadvertent activations, and other various possible outputs. The analyzer routine 400 begins at step 402 and proceeds to step 404 to parse the DOE file and then to step 406 to pick the first selection in the DOE table. At step 408, the analyzer routine 400 sets the replicator configuration file and then proceeds to run the replicator at step 410. Following operation of the replicator, the analyzer routine 400 proceeds to analyze the replicator logs at step 412. The output logs from each replicator operation may be analyzed to extract benchmarking information for use in testing and developing the proximity sensor interface.

Following the analysis of the replicator logs, the analyzer routine 400 proceeds to decision step 414 to determine if more selections are left in the DOE table and, if so, picks the next selection in the DOE table and returns to step 408. If more selections are not left in the DOE table, the analyzer routine 400 proceeds to compile the output in step 418 before ending at step 420. The analyzed data of all software configurations may be aggregated into one or more configuration/performance charts. The charts may include compiled and categorized performance data.

Figure 18:
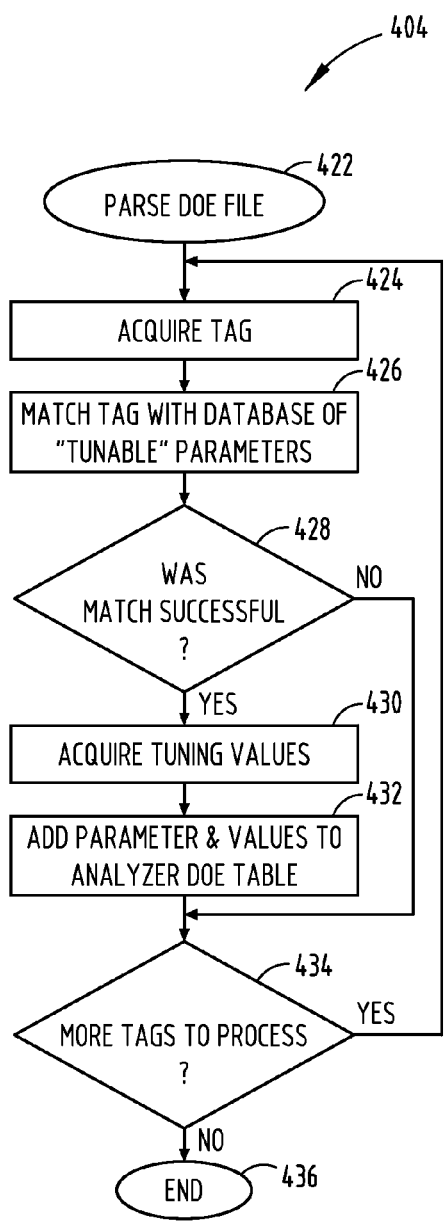
FIG. 18 is a flow diagram illustrating the parse DOE file subroutine of FIG. 17.

The parse DOE file subroutine 404 is illustrated in FIG. 18, beginning at step 422 and proceeding to acquire the tag data at 424 and to match the tag with the database of tunable parameters at step 426. Next, routine 404 proceeds to decision step 428 to see if the match was successful and, if so, acquires tuning values at step 430 and adds parameter and values to the analyzer DOE table at step 432 and proceeds to step 434. If the match was not successful, routine 404 proceeds to step 434. At step 434, routine 404 determines if more tags are to be processed and, if so, returns to step 424. Otherwise, routine 404 ends at step 436.

Figure 19:
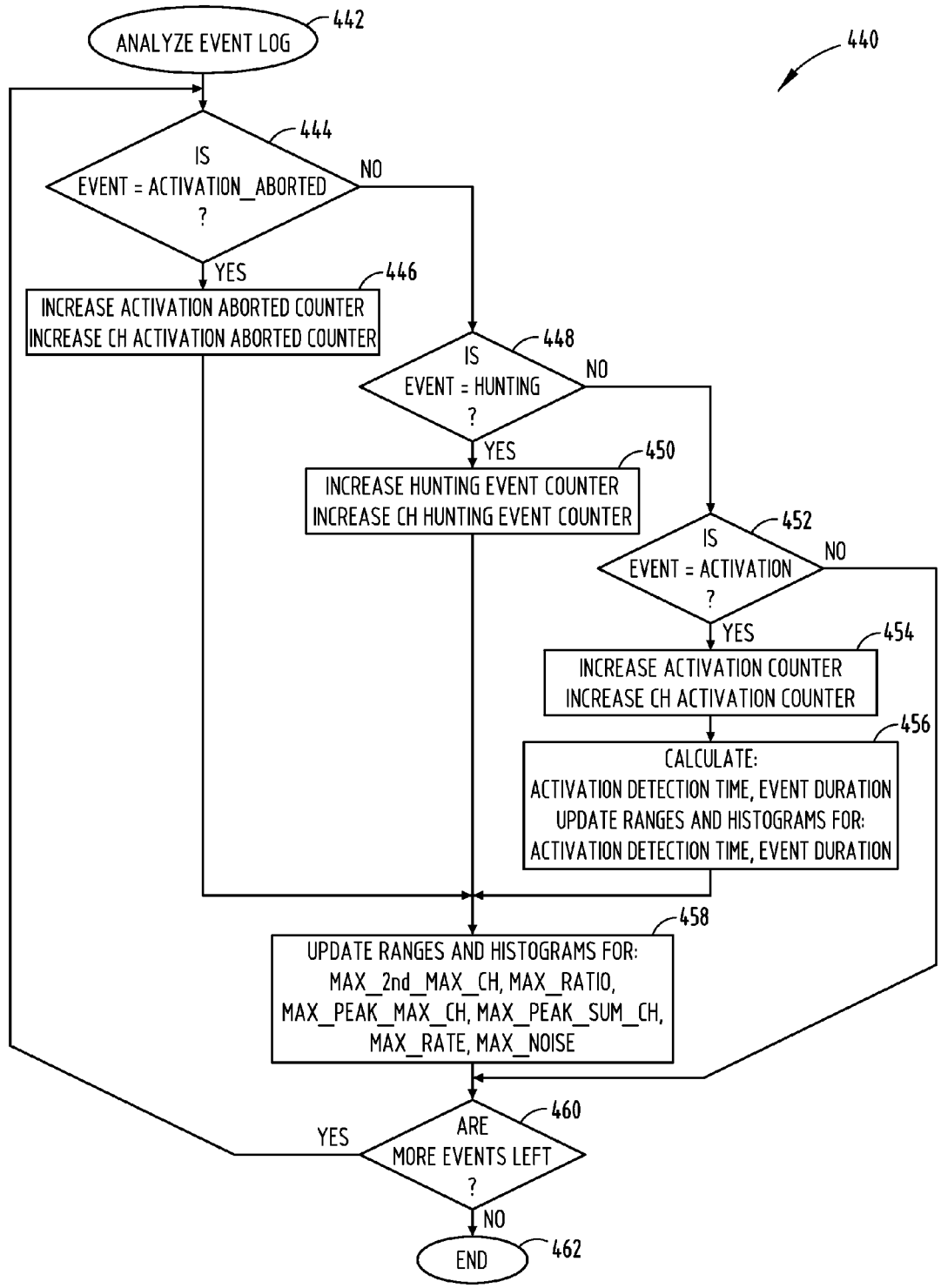
FIG. 19 is a flow diagram illustrating the analyzer event logs subroutine of FIG. 17, according to one embodiment.
Figure 20:
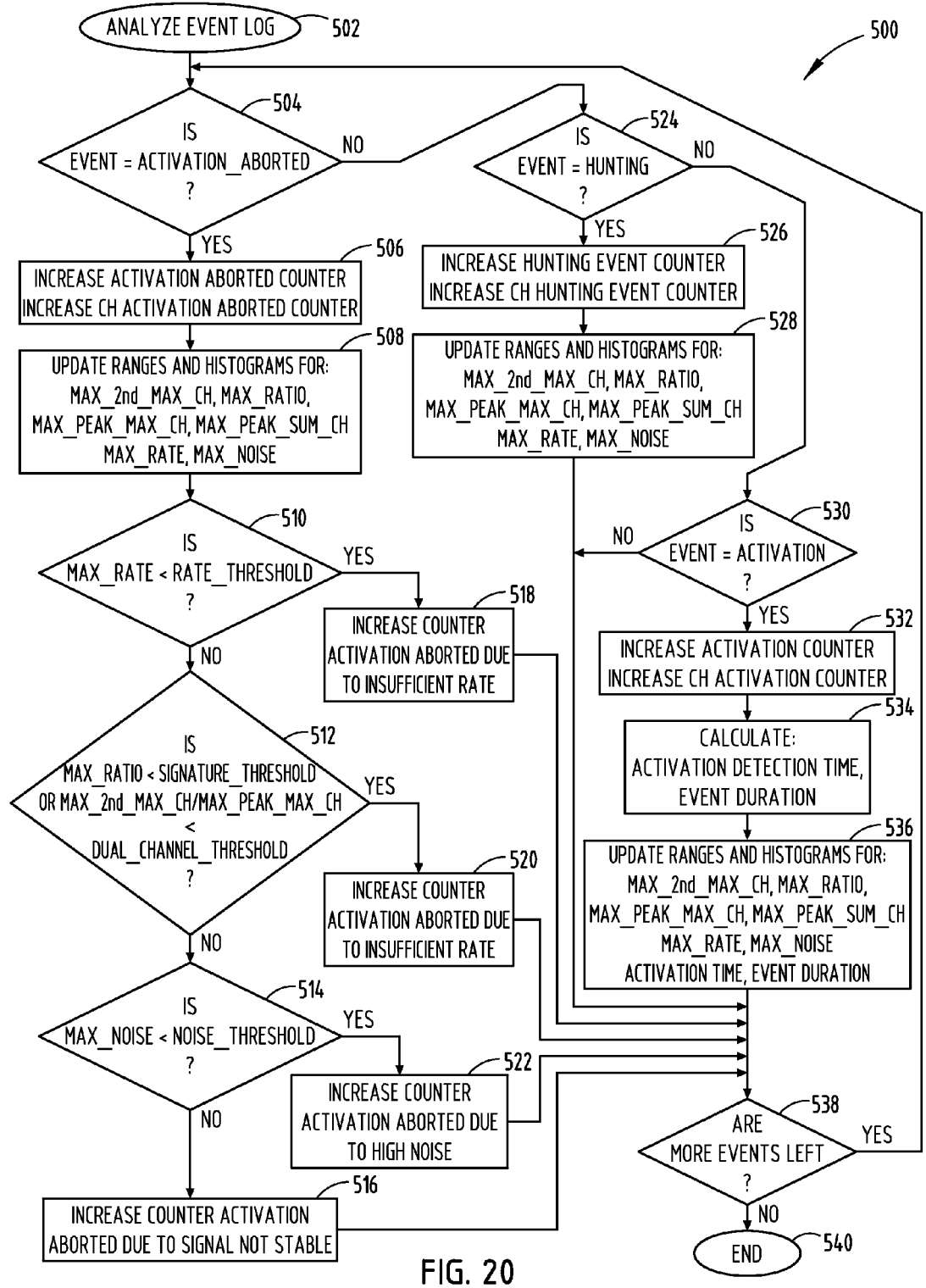
FIG. 20 is a flow diagram illustrating the analyzer event log subroutine of FIG. 17, according to another embodiment.

The analyze event routine 440 is illustrated in FIG. 19, according to one embodiment. The analyze event routine 440 may be implemented as a module that compiles the replicator output logs into a performance chart. In doing so, routine 440 begins at step 442 and proceeds to decision step 444 to determine if the event is an activation aborted event and, if so, increases the activation aborted counter and increases the channel activation aborted counter at step 446 before proceeding to step 458. If the event is not an activation aborted event, routine 440 proceeds to decision step 448 to determine if the event is a hunting event and, if so, increases the hunting event counter and increases the channel hunting event counter at step 450 before proceeding to step 458. If the event is not a hunting event, routine 440 proceeds to decision step 452 to determine if the event is an activation event and, if so, increases the activation counter and increases the channel activation counter at step 454. Thereafter, routine 440 calculates each of the following: the activation detection time, event duration, update ranges, and histograms for activation detection time and event duration at step 456, before proceeding to step 458. If the event is not an activation event, routine 440 proceeds to decision step 460. At step 458, routine 440 sets the update ranges and the histograms for each of the following: the second maximum max channel, the max ratio, the max_peak_max_ch, the max_peak_sum_ch, the max_rate, and the max_noise. Thereafter, routine 440 proceeds to decision step 460 to determine if more events are left and, if so, returns to step 444. Otherwise routine 440 ends at step 462.

An analyze event log routine 500 for a specific proximity switch assembly is illustrated, according to another embodiment. In this embodiment, additional information regarding the control routine is available that can be extracted from the log. This module may be implemented with a specific proximity sensor interface having more specific steps than the prior embodiment. In this embodiment, routine 500 begins at step 502 and proceeds to decision step 504 to determine if the event is an activation aborted event and, if so, proceeds to increase the activation aborted counter and increase the channel activation aborted counter in step 506. Thereafter, at step 508, routine 500 updates the ranges and histograms for each of the following: the max_second_max_channel, max_ratio, max_peak_max_channel, max_peak_sum_channel, max_rate, and max_noise. Thereafter, at decision step 510, routine 500 determines if the max rate is less than a rate threshold and, if so, increases the counter activation aborted due to insufficient rate at step 518. If the max rate is not less than the rate threshold, routine 500 proceeds to decision step 512 to determine if the max ratio is less than a signature threshold or if the max_second_max_channel divided by the max_peak_max_channel is less than a dual channel threshold and, if so, increases the counter activation aborted due to insufficient signature at step 520. If the output of decision block 512 is no, routine 500 proceeds to decision step 514 to determine if the max_noise is less than the noise threshold and, if so, increases the counter activation aborted due to high noise at step 522. Otherwise, routine 500 proceeds to increase the counter activation aborted due to the signal not being stable before proceeding to step 538.

If the event is not an activation aborted event, routine 500 proceeds to decision step 524 to determine if the event is a hunting event and, if so, proceeds to step 526 to increase the hunting event counter, and to increase the channel hunting event counter, and then to step 528 to update the ranges and histograms for each of the following: the max_second_max_channel, max_ratio, max_peak_max_channel, max_peak_sum_channel, max_rate, and max_noise before proceeding to step 538.

If the event is not a hunting event, routine 500 proceeds to decision step 530 to determine if the event is an activation event and, if so, increases the activation counter and increases the channel activation counter at step 532, and then proceeds to step 534 to calculate the activation detection time and event duration. Next, routine 500 proceeds to step 536 to update the ranges and histograms for each of the following: the max_second_max_channel, max_ratio, max_peak max_channel, max_peak_sum_channel, max_rate, max_noise activation time and event duration. Thereafter, method 500 proceeds to decision block 538 to see if there are more events left and, if so, returns to step 504. Otherwise, routine 500 ends at step 540.

To improve responsiveness of a proximity sensor interface and to reduce inadvertent actuations, it is advantageous to know whether the current tuning and setup of the software to be tested would result in a motion event triggering a switch activation event or not, and to further determine its classification, such as a tap or stable press event, a bare hand or a gloved hand event. If an event does not occur, it is further desirable to know whether it was because the operator was exploring the switches or whether the activation was aborted because of a safety lockout or because a triggering motion is deemed too slow or because the channel never reached a stable state due to presence of noise on the signal or because the signature ratio was not sufficient. The software replicator generates information to help understand whether an intended event, such as a moonroof close event was recognized, but not triggered because of suboptimal tuning of the interface or whether the operator had inadvertently triggered the lockout switch, or whether too many intended dome lamp activations were rejected because a humidity compensation mechanism was tuned too aggressively, according to some examples.

The software replicator may record various parameters that provide metrics for the development system to test and determine responsiveness and robustness of the proximity sensor interface. Parameters recorded may include the signal peak during the activation motion and its signature, the number of channels active during the motion, the second largest signal level as the event peaked, the fastest rate of the largest channel, and the duration of the motion event from start to detection and from start to completion. It should be appreciated that the replicator may record various other parameters and combinations of parameters.

Referring to FIG. 21, an example output of the software analyzer is illustrated in which five press events are processed by the software replicator and analyzer. All switch press events were interpreted as stable press events in this example. Each signal channel reached a peak capacitive count in the range of 191 to 324, with a maximum rate in the range of 195 to 325. The data illustrated is data acquired from testing by a single user. It should be appreciated that the user may activate one or more switches in a variety of activation techniques and that a plurality of users may operate the proximity sensor interface during data logging for acquisition and analysis of the data. The data acquired for channels 0-4 during an active stable event include glove wait, wait, max_channel, sum_channel, ratio of sum_channel to max_channel, peak_max, peak_sum, max_ratio, number of channels above activation threshold (N_act_channel), second max_channel, max_channel stable state, rate inhibit, and rate max. It should be appreciated that various other parameters may be acquired, recorded and analyzed by the development system.

Referring to FIG. 22, the output parameters from multiple tests are showed combined in a joint summary chart for multiple subjects, multiple test runs, and tests that are compiled automatically by the analyzer. The analyzer processes the outputs generated by the replicator and produces one or more performance charts indicative of the performance of the proximity sensor interface being tested. The joint summary performance chart in FIG. 22 shows compiled data for each of certain parameters and results for channels ch0-ch7 and assigns a pass and a fail number for each channel and a score indicative of the pass to fail ratio. In the example chart shown, a high failure rate was experienced for signal channels ch0 and ch1 which in a specific example was due to an aggressive rate monitoring algorithm for compensating for hardware condensation events. The software under test in this example includes an aggressive calibration setting which results in the failure of certain channels as determined by the development system without the need to repeat environmental testing with a large user clinic. Thus, software can be modified and tested efficiently and effectively.

Referring to FIG. 23, another simplified report generated by the analyzer is shown for Design Verification (DV) and Product Verification (PV) testing which only records the order in which channels were activated, whether the activation was with a long press or a tap, and the duration of the press. This simplified report can be used to match the activation sequence output to the desired target, the order in which the mechanical fingers activate the switches in the thermal environmental chamber, and determine whether all presses triggered activation or to check for the presence of extra unintended activations triggered by thermal-climatic events.

FIGS. 24-29 illustrate various charts generated during the testing of an overhead console having a capacitive switch assembly. In order to tune the capacitive switch assembly software, the simulator was operated with different threshold values for a rate monitoring algorithm, ranging from no rate monitoring to very aggressive rate monitoring (rate threshold of 0 counts/80 millisecond and 70 counts/80 milliseconds, respectively). More than 100 samples were collected in environmental chambers which had a maximum recorded humidity triggered event rate of around 25 counts/80 milliseconds.

Figure 24:
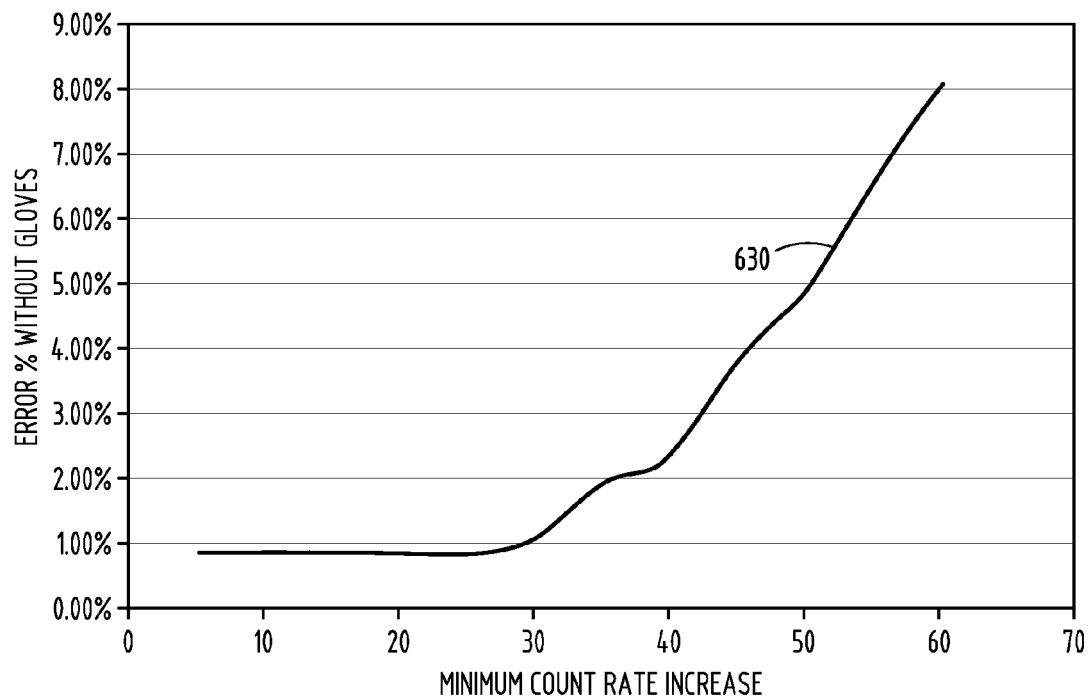
FIG. 24 is a graph illustrating percentage of activation error as a function of minimum count rate increase over 80 milliseconds for activation without gloves, according to one example.
Figure 25:
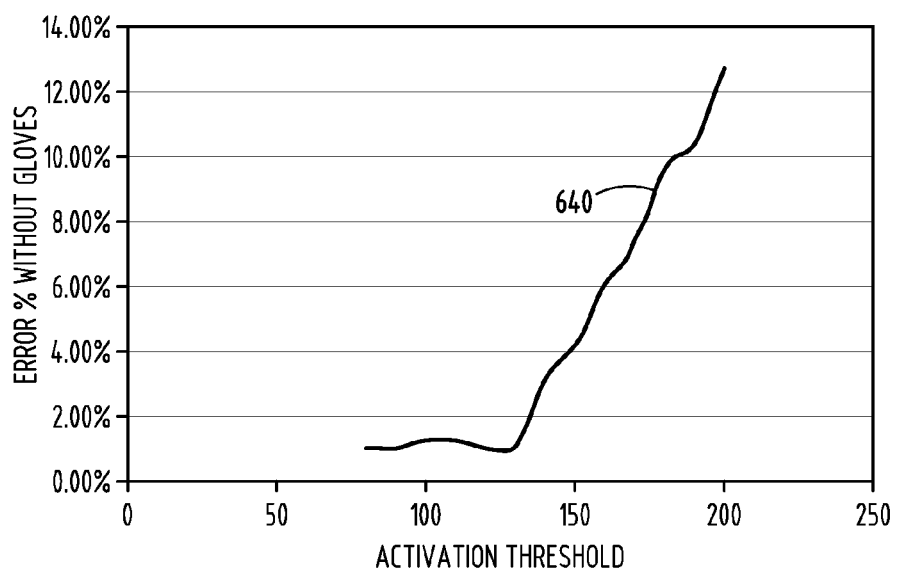
FIG. 25 is a graph illustrating average percentage of activation as a function of capacitive level activation threshold without gloves, according to one example.

The line 630 in the chart shown in FIG. 24 illustrates the percent of activation error as a function of the rate monitoring threshold for a bare hand activation without gloves. A knee in the data can be seen at a range of 30 counts/80 milliseconds. The minimum rate threshold was therefore set at 30 counts. Activation errors include both intended events not recognized and not exploring motion generating unintended events. Some of the intended events not recognized are the moonroof close and tilt aborted by the safety lockout switches which are not errors.

Next, the setting of the signal level threshold to recognize a valid activation was determined. Using a rate monitoring algorithm, the threshold level could be lowered and tested as shown in the line 604 of FIG. 25 which shows the average percent of activation errors as a function of capacitive level activation threshold for a bare handed interaction. In this example, a knee can be observed in the data at a value of just greater than 120 counts, above which there is a rapid increase in the error percent.

Figure 26:
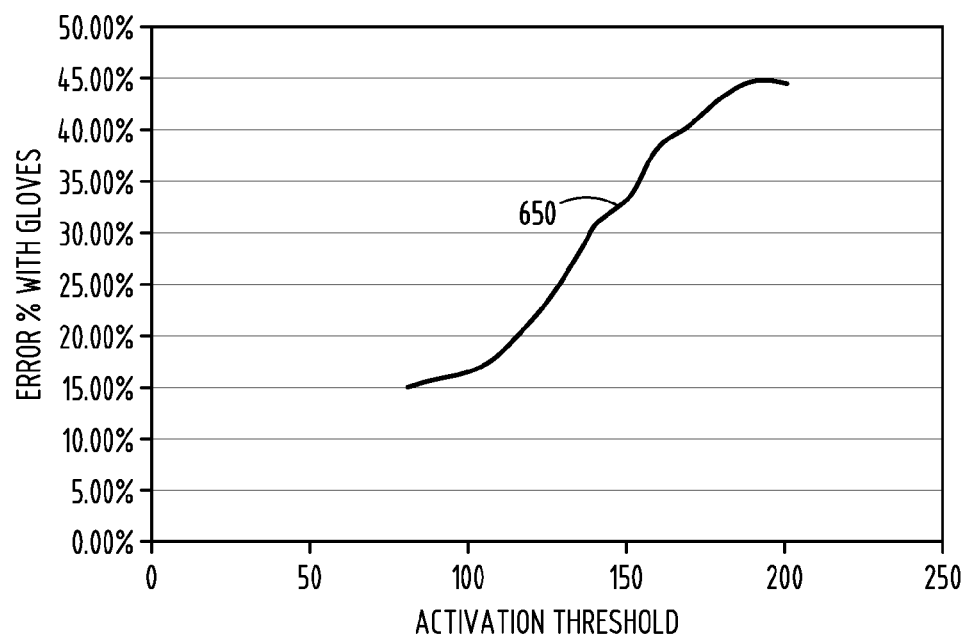
FIG. 26 is a graph illustrating an average percent of activation errors as a function of capacitive level activation threshold for gloved hand interaction, according to one example.

Referring to FIG. 26, the average percent of activation errors as a function of capacitive level threshold for a glove covered hand is illustrated by line 650. A knee is observed in the data at around 100 counts for the gloved interaction, but not as clearly marked as in the case of the bare handed interaction. To finalize a choice for the signal activation level threshold, the robustness of the system as a function of manufacturing variations and sensor sensitivity may be established. The threshold level was initially set at 120 counts and the software simulator ran on the same data set with the capacitive signal amplified to simulate a change in sensitivity ranging from −60% to +60%.

Figure 27:
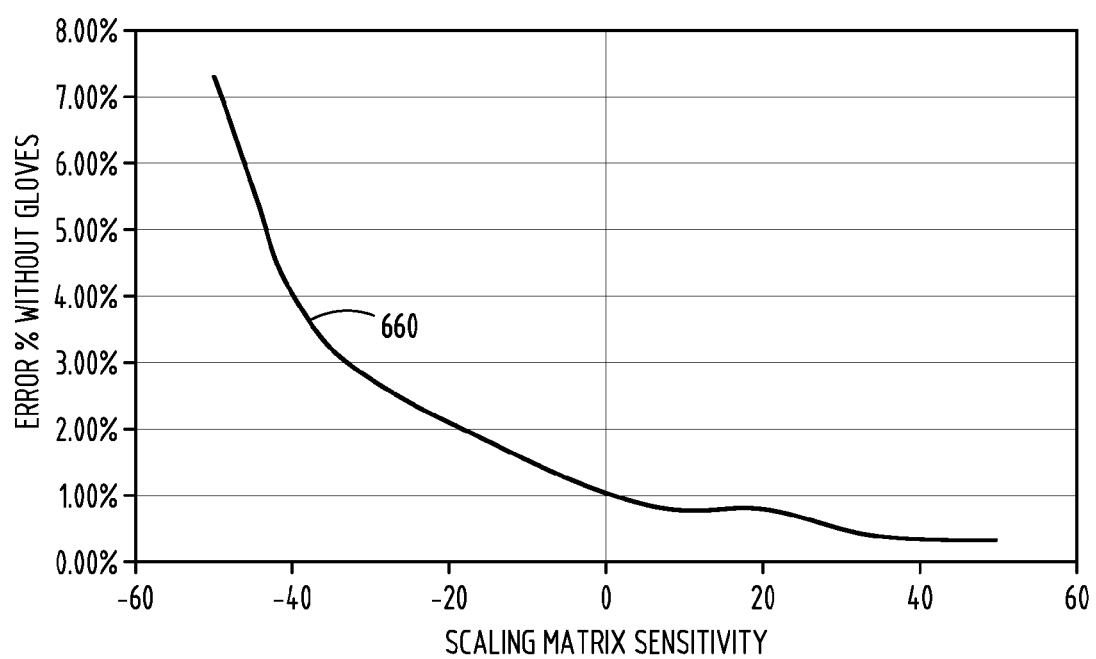
FIG. 27 is a graph illustrating an average percent of activation errors for switches as a function of decreased/increased sensitivity without gloves, according to one example.
Figure 28:
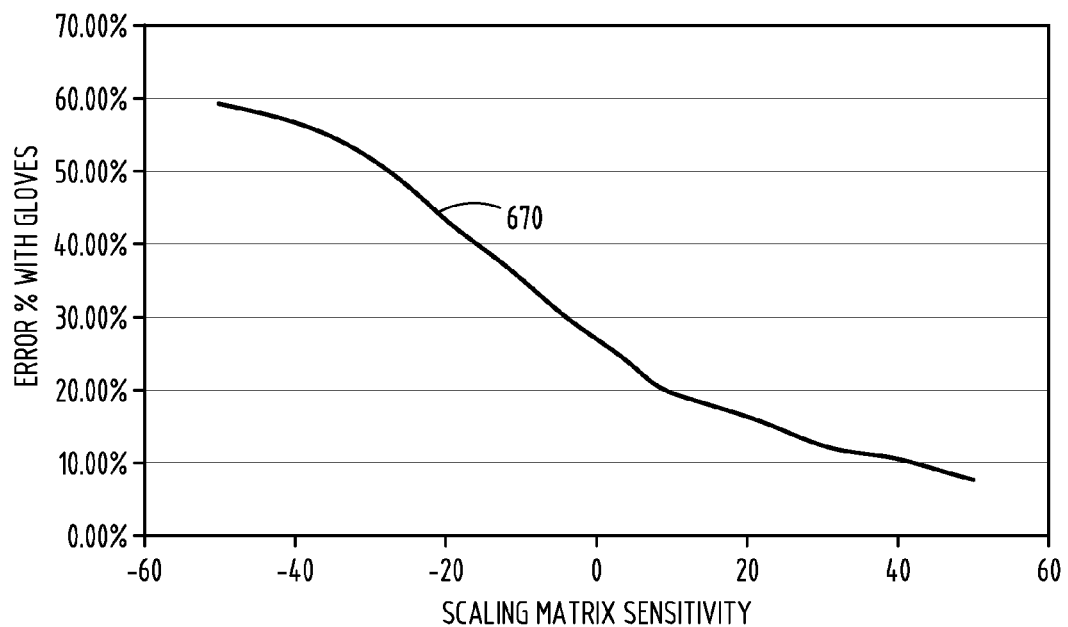
FIG. 28 is a graph illustrating an average percent of activation errors for switches as a function of decreased/increased sensitivity for gloved hand interaction, according to one example.

Referring to FIGS. 27 and 28, average percent of activation errors for two overhead console dome lamp switches as a function of decreased/increased sensitivity (expressed in percent) for bare handed interaction shown by line 660 in FIG. 27 and gloved interaction shown by line 670 in FIG. 28 are illustrated. A 20% reduction in sensitivity (−20) from the midrange point (0) is sufficient to double the amount of activation errors in both bare handed and gloved interaction. In this example, a decision was made to set the activation threshold to 80 counts. Thus, even a sensitivity deterioration of 50% (80 to 100 counts) would yield a less than 1% activation error with bare handed interaction and 15% activation error with gloved interaction.

Figure 29:
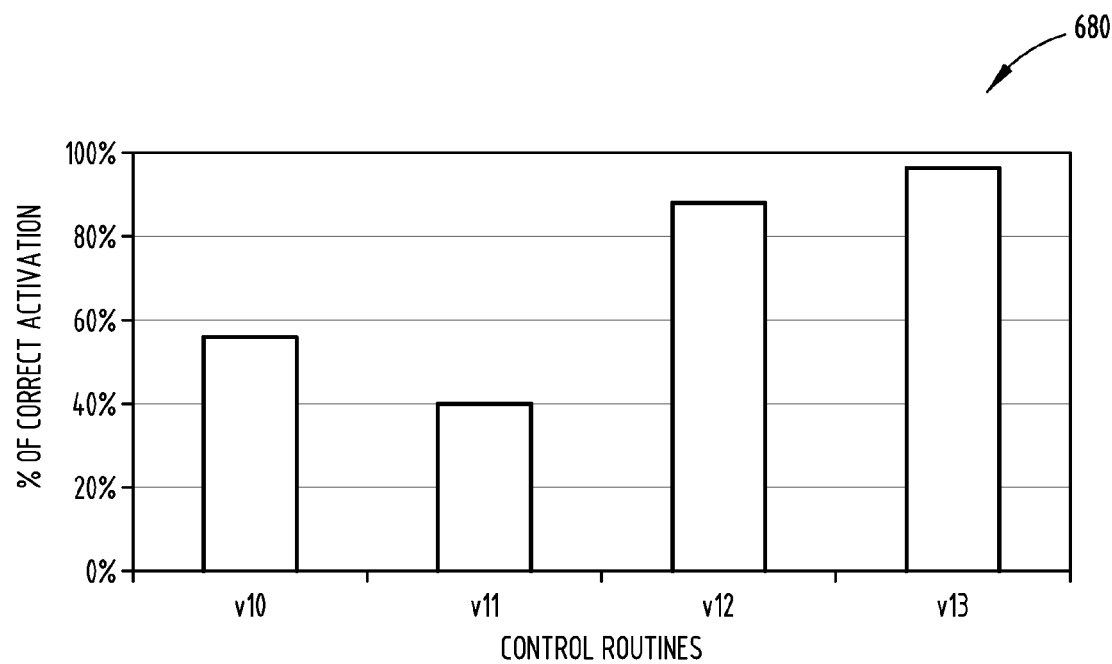
FIG. 29 is a graph comparing four versions of software that were tested using the development tool, according to one example.

Referring to FIG. 29, four versions of proximity sensor interface software $V_{10}$-$V_{13}$ that were tested are compared and scored as a percent of the correct activation are shown output in a chart labeled 680 generated by the analyzer. The development system advantageously was employed to develop the final software release for a proximity sensor interface that compensated for a condensation hardware issue, but also achieve excellent responsiveness and robust noise rejection. It should be appreciated that the software replicator advantageously tested the software using the data log and that the analyzer provided an output score indicative of the performance of the various versions of the software, thus enabling a developer to effectively and efficiently determine the optimal software package.

Accordingly, the proximity interface development system advantageously allows for the testing of various software modifications to a proximity sensor interface, such as a proximity switch assembly. The system efficiently and effectively tests variations in the software without having to duplicate environmental testing with a large pool of users during a clinic. The system further advantageously processes the analyzed data to provide an output for the developer to use and developing the optimal proximity sensor interface.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A proximity interface development system comprising:
   one or more software routines developed are stored in a memory to operate a proximity sensor interface having a plurality of proximity sensors;
   a data logger acquiring proximity sensor data while operating the proximity sensor interface; and
   a processor configured as a replicator for replicating the proximity sensor interface based on the one or more software routines and generating outputs of the replicated proximity sensor interface based on the proximity sensor data, said processor further generating performance data and further comprising an analyzer for analyzing the outputs of the replicator and generating a report indicative of the performance data of the proximity sensor interface with the one or more software routines.

2. The system of claim 1 further comprising an input for receiving at least one setting to adjust one or more parameters of the proximity sensor interface, wherein the processor processes the at least one setting in combination with the software routines and the proximity sensor data to generate the outputs.

3. The system of claim 2, wherein the at least one setting comprises a scaling factor for setting sensor sensitivity.

4. The system of claim 2, wherein the at least one setting comprises a threshold value.

5. The system of claim 1, wherein the proximity sensor interface comprises a capacitive switch.

6. The system of claim 5, wherein the capacitive switch comprises a proximity sensor, wherein a signal associated with an activation field is processed to determine activation of the proximity sensor.

7. The system of claim 1, wherein the proximity sensor interface is developed for use on a vehicle by a passenger in the vehicle.

8. The system of claim 7, wherein the proximity sensor interface comprises a capacitive switch comprising one or more capacitive sensors.

9. The system of claim 1, wherein the development system comprises a computer having the processor separate from the proximity sensor interface, wherein the computer comprises the memory.

\* \* \* \* \*